(12) United States Patent
Bourgeois

(10) Patent No.: US 10,679,805 B2
(45) Date of Patent: Jun. 9, 2020

(54) ELECTRICAL TEST SWITCH WITH SOLIDIFYING BASE

(71) Applicant: Jean-Raymond Bourgeois, Morin-Heights (CA)

(72) Inventor: Jean-Raymond Bourgeois, Morin-Heights (CA)

( * ) Notice: Subject to any disclaimer, the term of this patent is extended or adjusted under 35 U.S.C. 154(b) by 0 days.

(21) Appl. No.: 15/565,818

(22) PCT Filed: Apr. 11, 2016

(86) PCT No.: PCT/CA2016/050412
§ 371 (c)(1),
(2) Date: Oct. 11, 2017

(87) PCT Pub. No.: WO2016/161522
PCT Pub. Date: Oct. 13, 2016

(65) Prior Publication Data
US 2018/0108503 A1    Apr. 19, 2018

Related U.S. Application Data

(60) Provisional application No. 62/145,850, filed on Apr. 10, 2015.

(51) Int. Cl.
*H01H 21/00* (2006.01)
*H01H 21/12* (2006.01)
(Continued)

(52) U.S. Cl.
CPC .............. *H01H 21/12* (2013.01); *G01R 1/206* (2013.01); *H01H 21/56* (2013.01)

(58) Field of Classification Search
CPC .............. G01R 1/0416; G01R 1/06705; G01R 1/06711; G01R 1/0675; G01R 1/07392; G01R 1/206; G01R 31/2806; G01R 35/04; H01R 9/2633; H01R 13/10; H01R 13/6335; H01R 2201/20; H01R 31/06; H01R 9/00; H01R 9/2408; H01R 9/2433; H01H 15/00;
(Continued)

(56) References Cited

U.S. PATENT DOCUMENTS 1,338,180 A    4/1920  Horton
1,361,955 A    12/1920 Ball et al.
(Continued)

FOREIGN PATENT DOCUMENTS

GB         219408        7/1924

OTHER PUBLICATIONS

The Eastern Specialty Co., "Meter Test Switch", Bulletin No. 112 Rev., Nov. 1974, 4 pages.
(Continued)

*Primary Examiner* — Ahmed M Saeed

(57) ABSTRACT

A test switch for use in electrical power distribution networks is provided. The test switch facilitates the connection between the power distribution networks' equipment and test equipment used to effect tests on the power distribution networks' equipment. The test switch has a solidifying base which decouples the fastening of the body of the switch to the base of the test switch from the fastening of the test switch on an external surface/equipment. Various locking mechanisms for preventing use of or tampering with the test switch are also provided.

4 Claims, 35 Drawing Sheets

(51) Int. Cl.
*G01R 1/20* (2006.01)
*H01H 21/56* (2006.01)

(58) Field of Classification Search
CPC .......... H01H 15/04; H01H 1/225; H01H 1/42; H01H 1/44; H01H 71/0271; H01H 9/286; H01H 21/54; H01H 47/002
USPC .... 324/555, 537, 500, 543, 756.07; 439/517
See application file for complete search history.

(56) References Cited

U.S. PATENT DOCUMENTS

| | | | |
|---|---|---|---|
| 5,722,534 A | 3/1998 | Wright | |
| 6,384,350 B1* | 5/2002 | Shincovich | .......... H01R 9/2433 200/5 A |
| 7,371,979 B2 | 5/2008 | Fuzetti et al. | |
| 7,563,999 B2 | 7/2009 | Ball et al. | |
| 8,188,396 B2 | 5/2012 | Bou et al. | |
| 8,604,366 B2 | 12/2013 | Bower et al. | |
| 2014/0097827 A1 | 4/2014 | Rudaitis et al. | |
| 2014/0253146 A1 | 9/2014 | Kesler | |
| 2015/0249337 A1* | 9/2015 | Raneri | .................... H02J 3/005 307/24 |

OTHER PUBLICATIONS

The Eastern Specialty Company, "Meter Test Switch", Bulletin No. 112, Mar. 1960, 4 pages.
ABB Inc., "FT Flexitest™ Switches", Descriptive Bulletin 41-077, Apr. 2010, 32 pages.
Meter Devices Company Inc., "Compact Meter and Relay Knife Type Test Switches", Bulletin No. CS-474, Feb. 18, 1981, 119 pages.
The Eastern Speciality Company, "Meter Test Switches", Bulletin No. 44, 1940, 4 pages.
States, "Type MTS Miniature Test Switches", 2009, pp. 30-41.

* cited by examiner

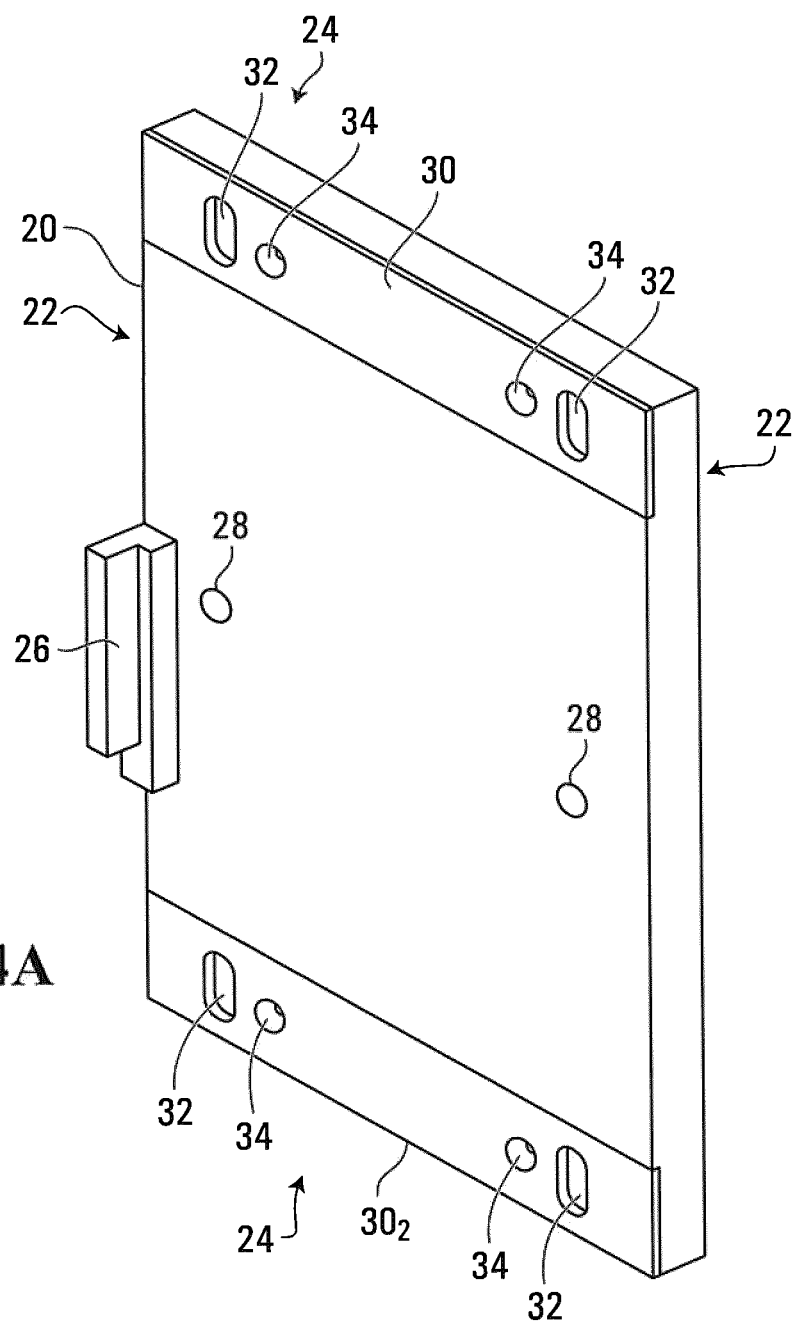
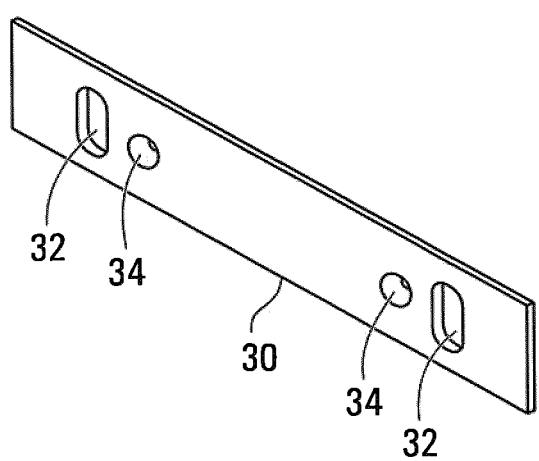
FIG. 4A
FIG. 4B

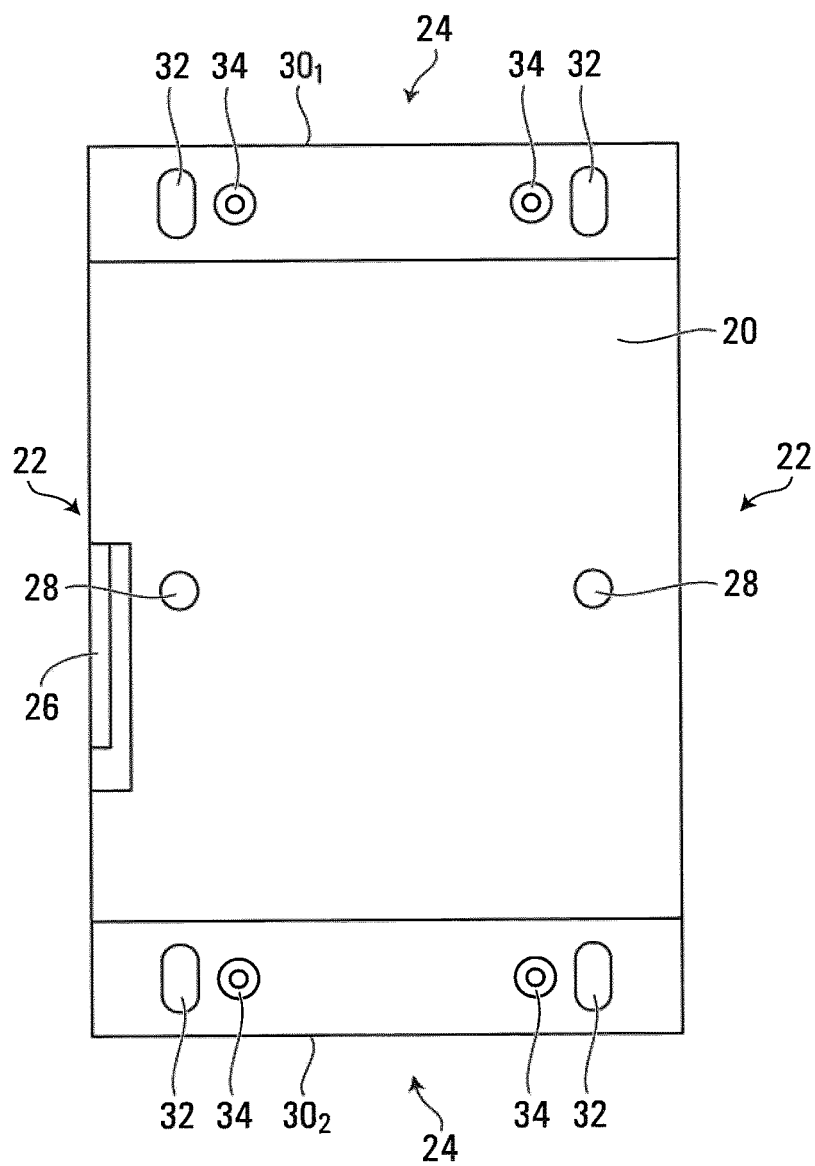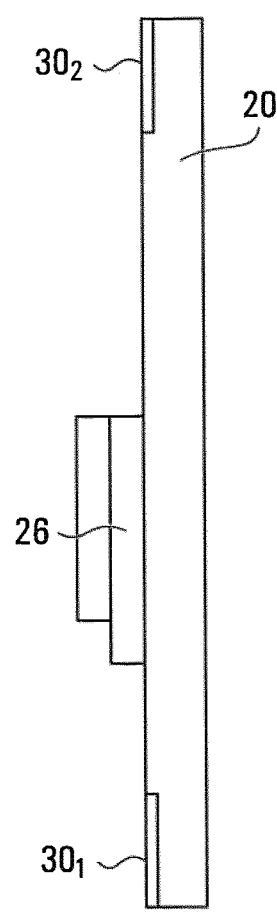
FIG. 5A
FIG. 5B

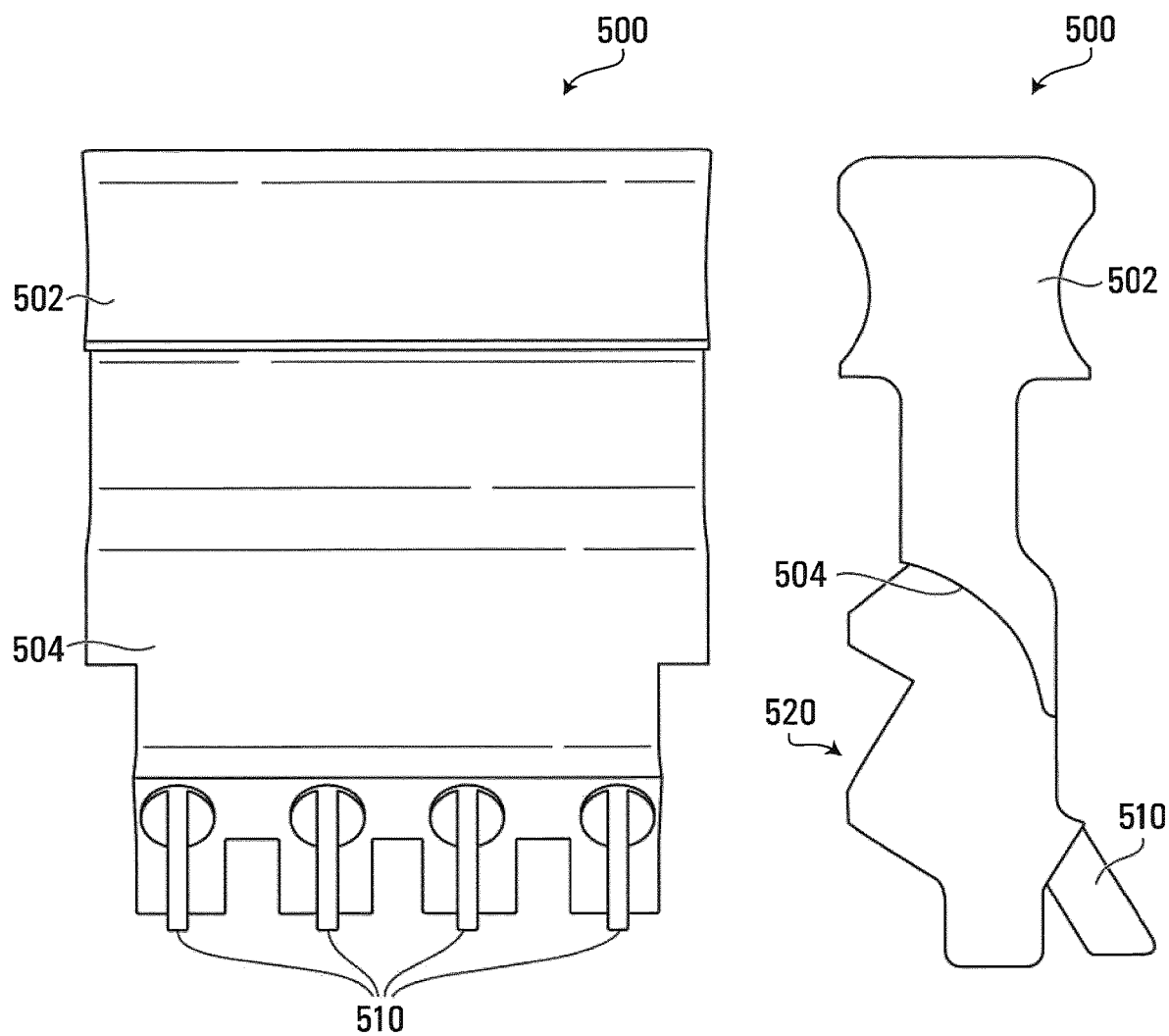
FIG. 17B  FIG. 17C

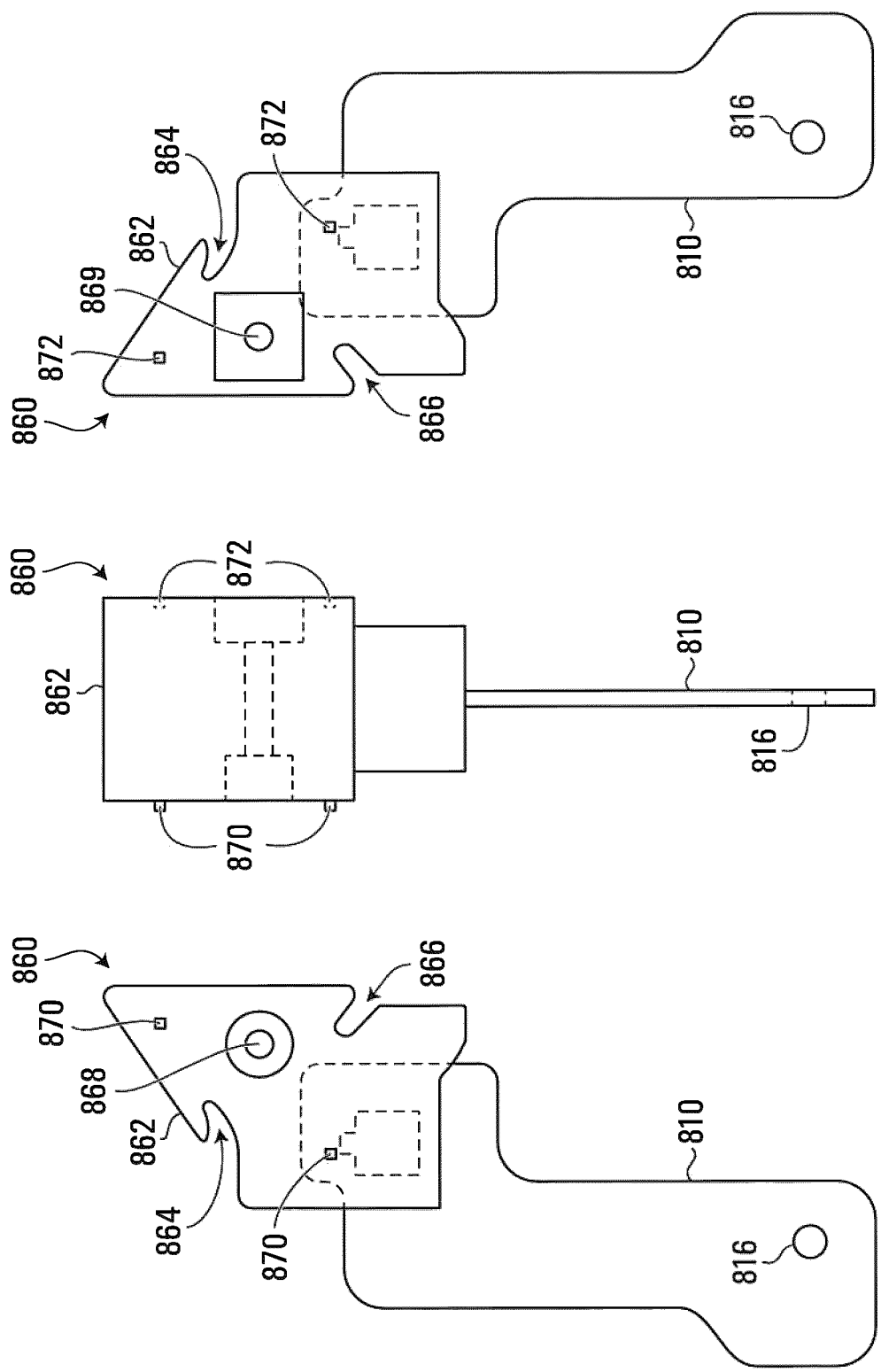

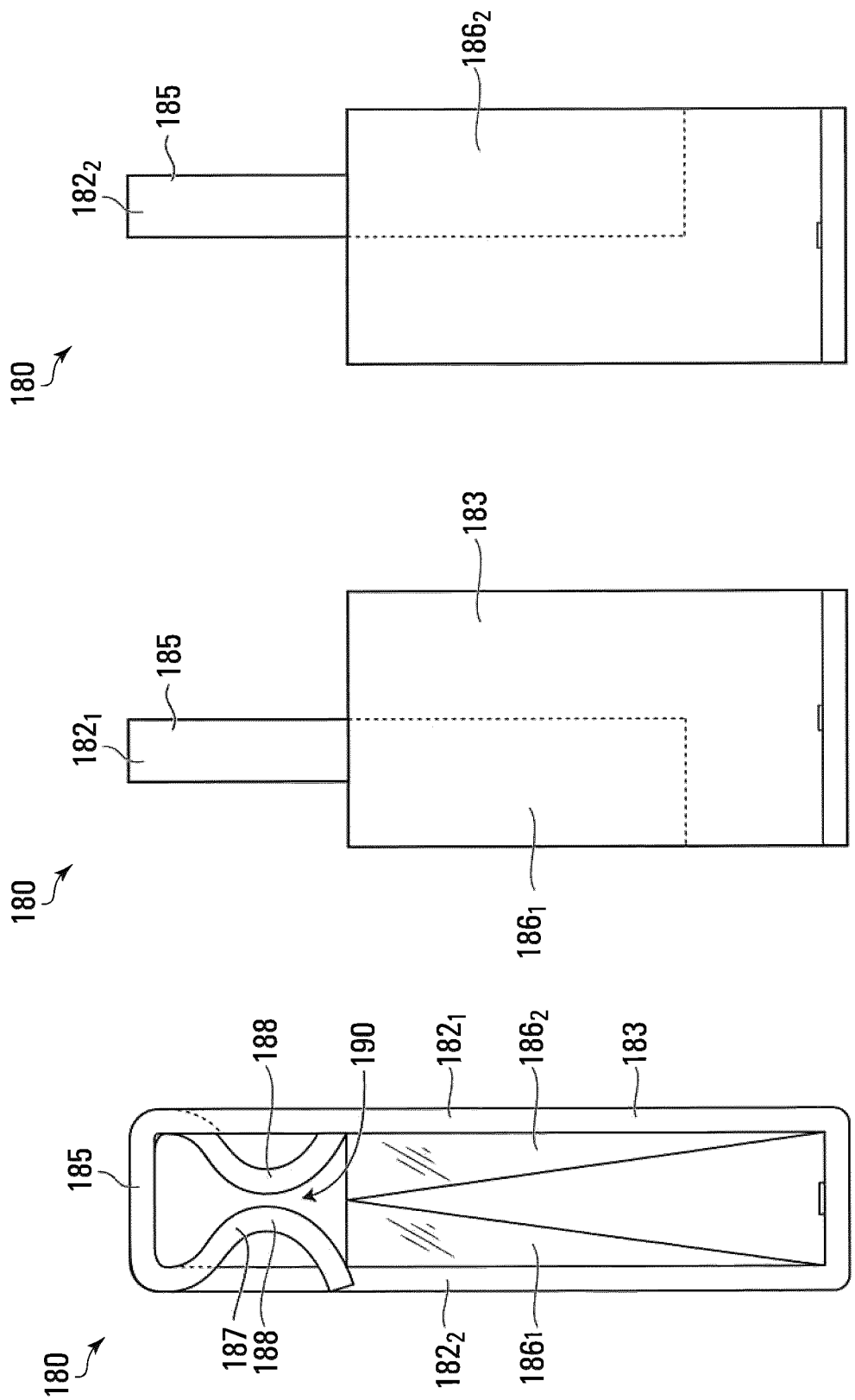

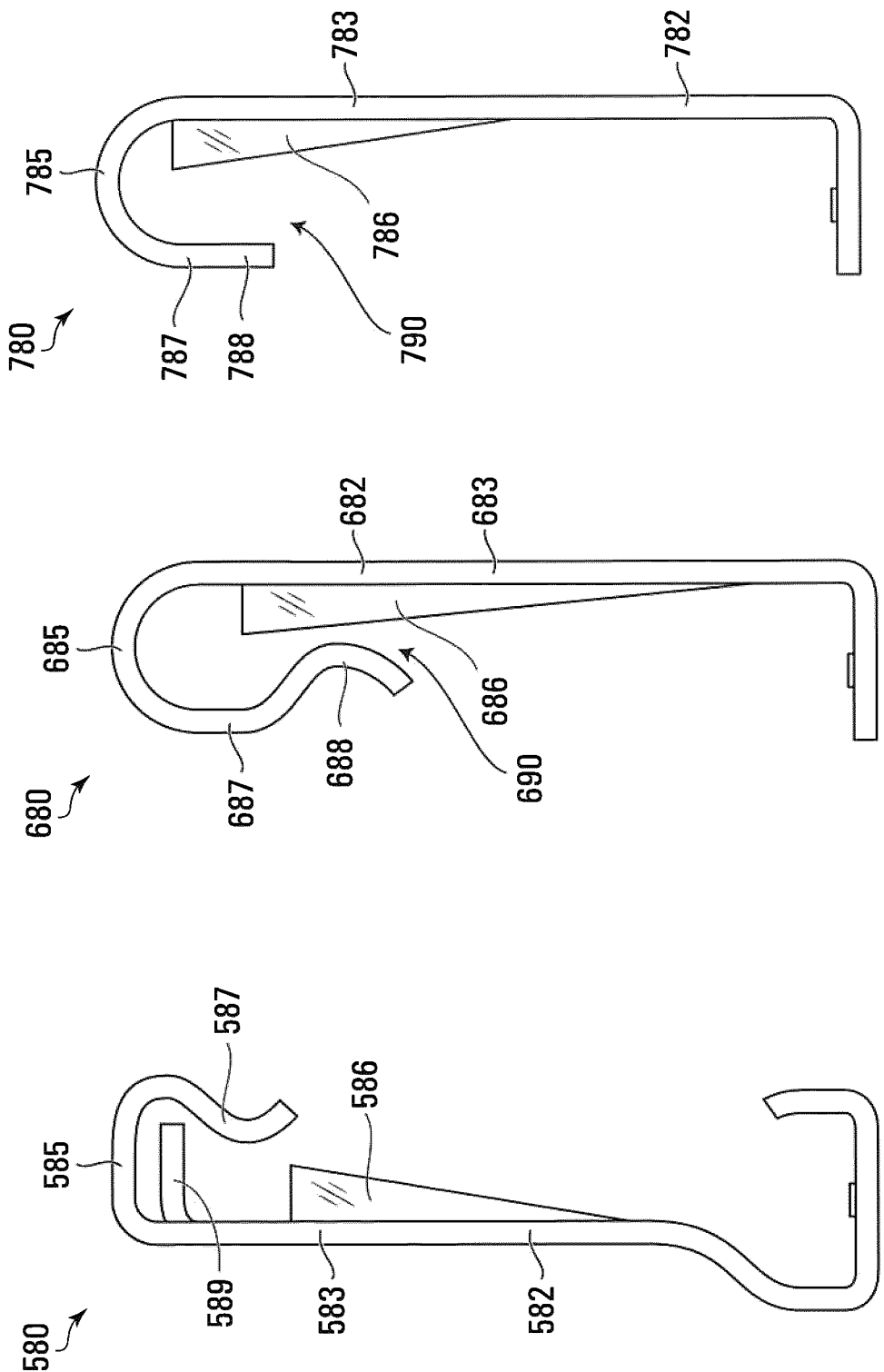

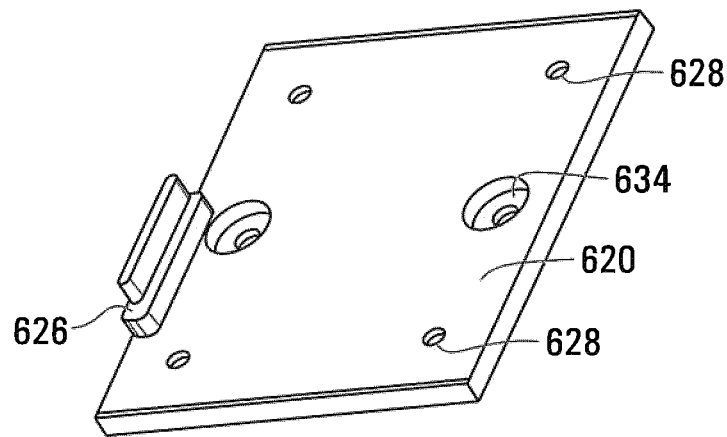
FIG. 34
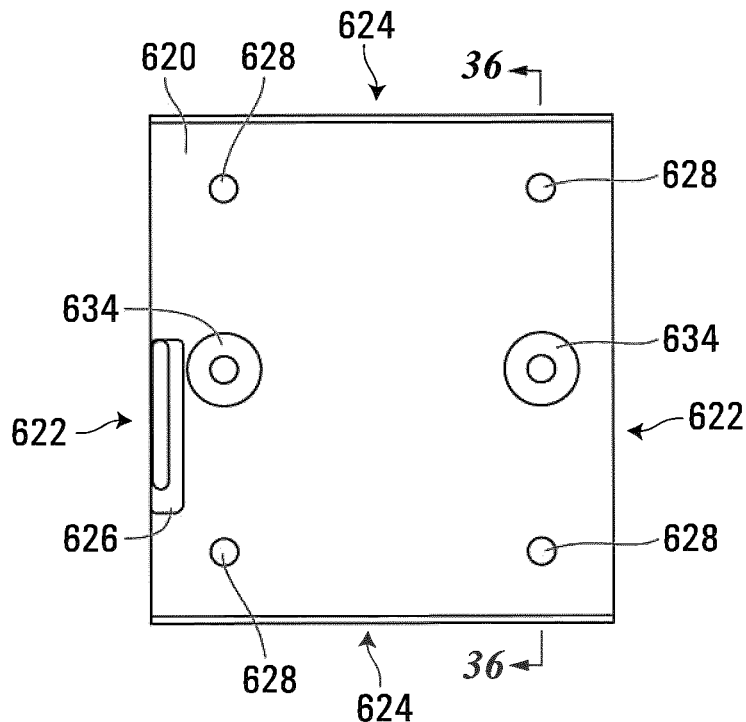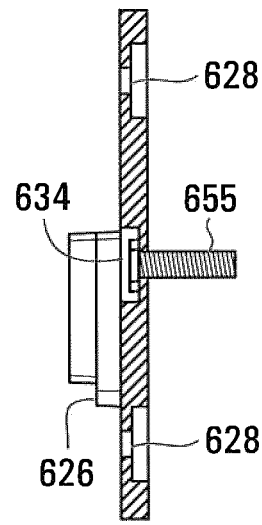
FIG. 35  FIG. 36

ELECTRICAL TEST SWITCH WITH SOLIDIFYING BASE

FIELD OF THE INVENTION

The present invention generally relates to electrical switches, and more particularly to single- or multi-pole test switches for use in high-voltage environments having a solidifying base.

BACKGROUND

Test switches are electrical circuit components typically used to simplify the use and replacement of test equipment in electrical power distribution networks, or maintenance of such test equipment, and may be mounted on switchboard panels or interconnection boxes. Test or measuring equipment, including meters and non-drawout relays, may be connected to a first set of terminals of the test switch, and the power distribution network's electrical equipment may be connected to a second set of terminals. When the switch is closed, the test equipment is connected to the power distribution electrical equipment; when the switch is opened, the test equipment is disconnected from the network and may be easily replaced as needed.

Test switches are typically available in single- or multiple-poles units. Each pole consists of a single throw knife blade type switch mounted on a moulded base having pole-isolating barriers which prevent accidental short circuiting between poles. This reduces the possibility of an operator coming in contact with live parts. Moulded Bakelite handles can be provided for either individual or group operation of the poles. When mounted on a switchboard panel for facilitating the testing and changing of meters and non-drawout relays, each stud on a relay or meter is connected to one pole of the test switch. Studs that are terminals of current coils are connected to current poles which have short-circuiting posts that automatically short-circuit the current transformer secondaries when the test switch is opened. When mounted on interconnection boxes to open the control circuits for safety maintenance of equipment, each wire is connected to one pole of the test switch. Wires that are terminals of auxiliary normally closed contact (type B) are connected to poles which have short-circuiting posts that automatically short-circuit and hold up the right image when the test switch is open.

Test switches may be mounted to other electrical equipment and then transported to a location where the electrical equipment is installed. During transportation, G-forces and vibration may cause the test switch to become more loosely attached, or even to become detached from the electrical equipment, and may further cause structural damage to the test switch. To overcome that problem, service personnel are known to disregard the manufacturer fastener torqueing specifications and may choose to apply a higher than the specified torque to prevent the fasteners from becoming loose again. That attempt to solve a problem may create another one, which is cracking of the body of test switches that were not designed to withstand the additional level of fastener torque, which may require the replacement of the entire unit.

The body of the test switch is made of electrically insulating material, such as Bakelite. It has a generally flat bottom which is mounted against the mounting surface that is also generally flat. However, as a result of manufacturing process variations, the degree of flatness of the bottom surface of body cannot be guaranteed with the result that some units may exhibit a surface that is somewhat concave. That concavity produces a bending stress in the body that is dependent on the degree of torque applied to the fasteners; the higher the torque the higher the degree of stress. At some point, the stress may be high enough to cause the body to crack.

As a result, test switches which address at least some of these issues may be of interest to the industry.

SUMMARY OF THE INVENTION

In accordance with a first aspect, the present disclosure provides a test switch allowing for electrically isolating testing or measuring equipment from an electrical power distribution network. The test switch includes a body of electrically insulating material that is affixed to a base, which is used to attach the test switch to a mounting surface. The body of electrically insulating material is affixed to the base by a first fastening arrangement, while the base is attached to the mounting surface via a second fastening arrangement. By decoupling the connection of the body to the base from the connection of the base to the mounting surface reduces the risk of cracking the body of the switch as a result of over-torqueing the fasteners on the base, especially in the course of in-field installations or repairs, is reduced.

In accordance with a further aspect, the present disclosure provides a locking device for a test switch which substantially covers all or part of the test switch to prevent unauthorized access to the test switch.

In accordance with another aspect, there is provided an electrical test switch for testing electrical equipment. The electrical test switch comprises a base and a body mounted to the base. The base comprises a plate element comprising a plurality of mounting apertures. A first subset of the mounting apertures is configured to receive first fasteners for mounting the base to a mounting surface of the electrical equipment. The body comprises a plurality of pole-isolating barriers positioned parallel to one another and affixed to the base via a second subset of the mounting apertures. The second subset of the mounting apertures is configured to receive second fasteners for mounting the body to the base. The body further comprises at least one pole connector disposed between adjacent ones of the pole-isolating barriers and a handle assembly configured to selectively engage or disengage the at least one pole connector such as to electrically connect or disconnect the test switch to the electrical equipment. Each pole connector defines a pole of the test switch.

In accordance with another aspect, there is provided an electrical test switch for testing electrical equipment. The electrical test switch comprises a base and a body mounted to the base. The base comprises a plate element having a top surface and a bottom surface opposite to the top surface.

The plate element comprises a plurality of mounting apertures for mounting the base to a mounting surface of the electrical equipment. The base further comprises an abutment member protruding from the top surface of the plate element. The body comprises a plurality of pole-isolating barriers positioned parallel to one another and affixed to the base, at least one pole connector disposed between adjacent ones of the pole-isolating barriers, and a handle assembly configured to selectively engage or disengage the at least one pole connector such as to electrically connect or disconnect the test switch to the electrical equipment. Each pole connector defines a pole of the test switch. The abutment member of the base is configured to abut a given one of the pole-isolating barriers to reduce flexing of the test switch when the test switch is affixed with fasteners of a support structure.

These, and other aspects of the present disclosure, will become apparent to those of ordinary skill in the art upon review of the following description, in conjunction with the accompanying drawings.

BRIEF DESCRIPTION OF THE DRAWINGS

Examples of embodiments of the present disclosure will now be described in greater detail with reference to the accompanying drawings, in which:

FIGS. 4A-B are respectively perspective views of the solidifying base and of end covers of the embodiment shown in FIGS. 2 and 3;

FIGS. 5A-B are respectively top and side views of the solidifying base;

FIGS. 17A-D are perspective, front, side, and rear views of a current injector;

FIGS. 23A-C are side and top views of an embodiment of a handle finger of an alternative handle assembly for the test switch;

FIGS. 24A to 24C are respective front, right side, and left side elevation views of a short-circuit connector of the test switch in accordance with an alternative embodiment;

FIG. 29 is a front elevation view of a variant of the short-circuit connector of FIG. 26;

FIG. 30 is a front elevation view of the short-circuit connector in accordance with another embodiment;

FIG. 31 is a front elevation view of a variant of the short-circuit connector of FIG. 30;

FIGS. 34 and 35 are perspective and top views of a base of the test switch in accordance with an alternative embodiment; and FIG. 36 is a cross-sectional view of the base of FIGS. 34 and 35 taken along line 6-6 of FIG. 35.

Figure 1:
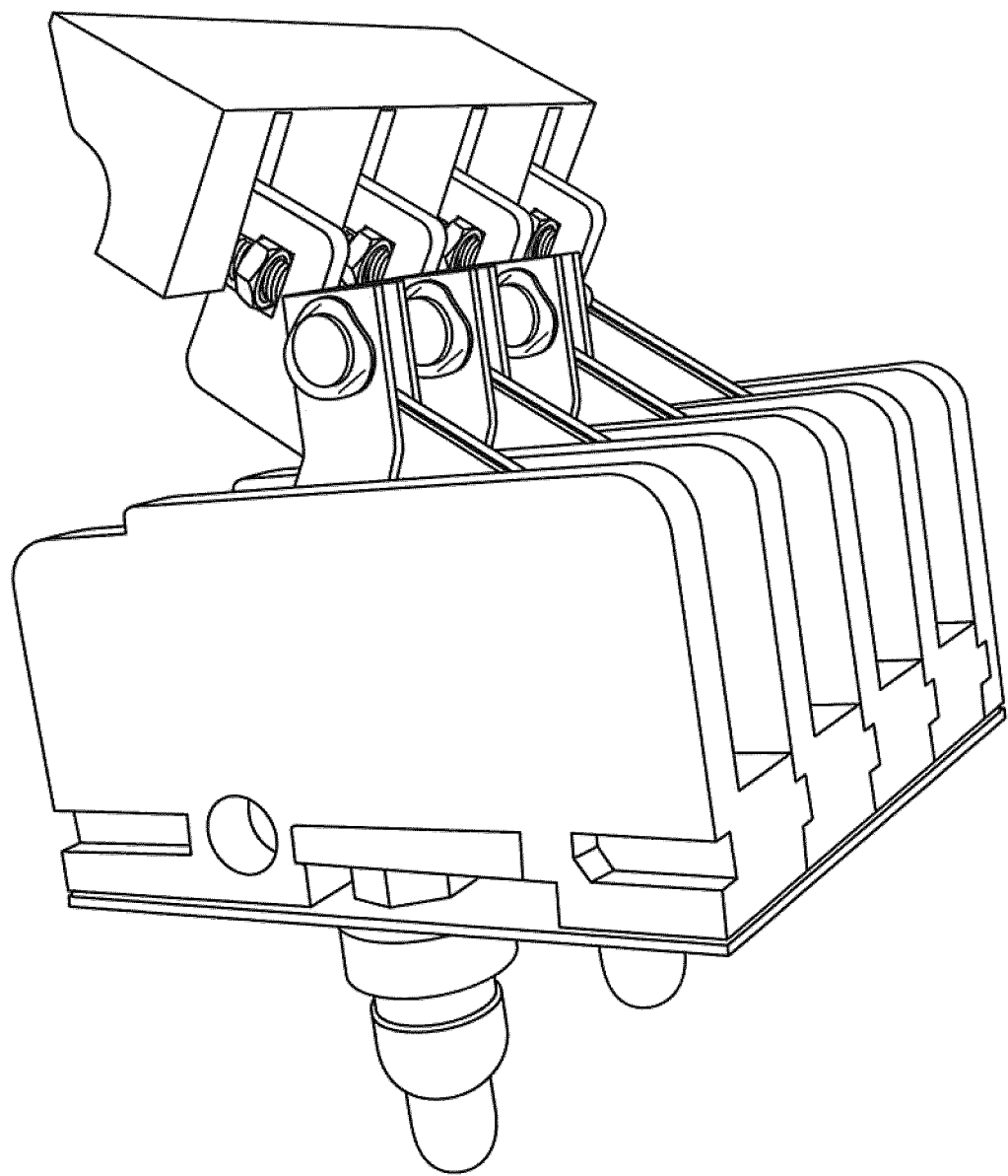
FIG. 1 is a perspective view of a prior art electrical test switch.

In the drawings, embodiments of the invention are illustrated by way of example. It is to be expressly understood that the description and drawings are only for the purpose of illustrating certain embodiments of the invention and are an aid for understanding. They are not intended to be a definition of the limits of the invention.

DETAILED DESCRIPTION

Figure 2:
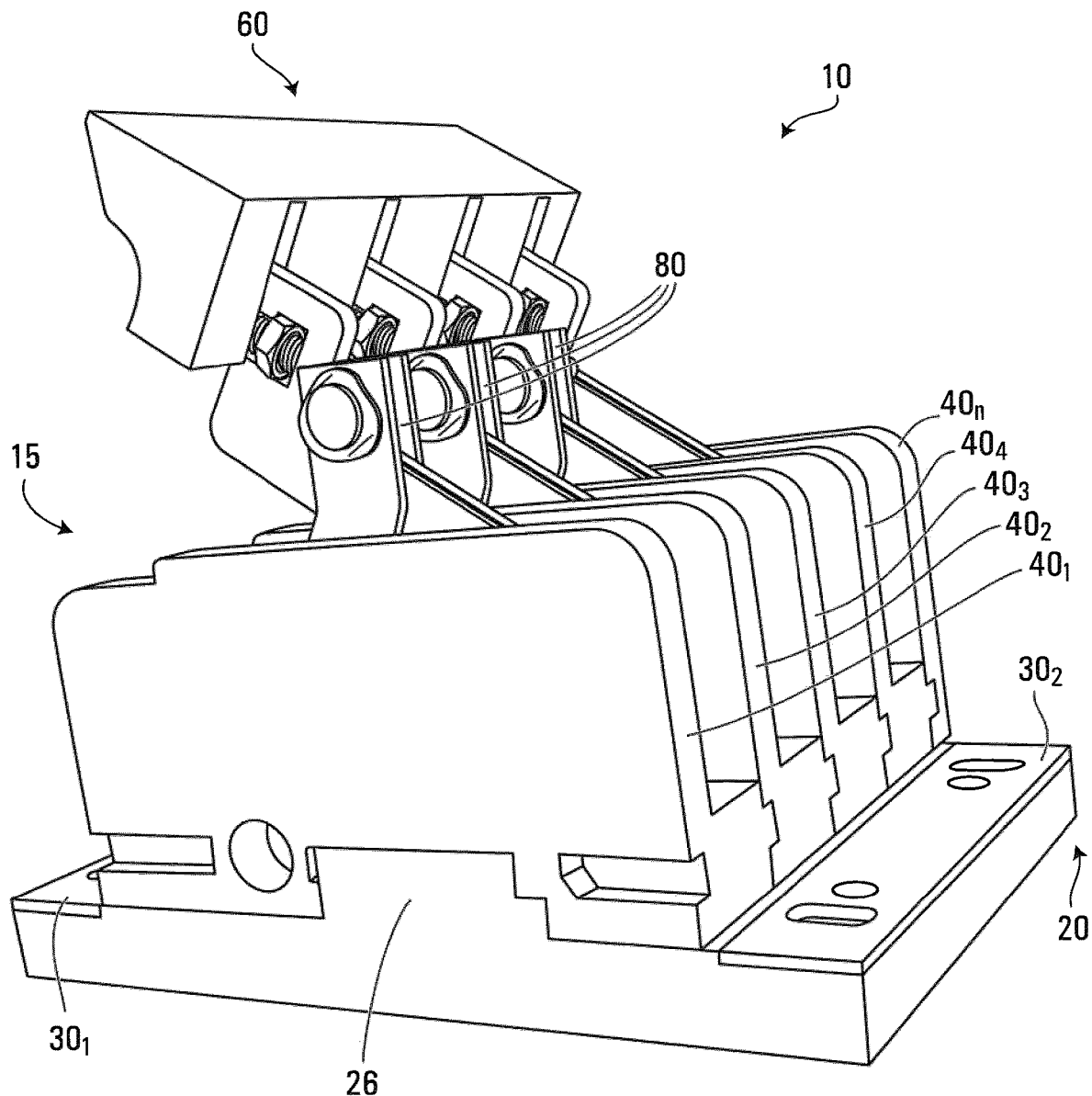
FIG. 2 is a perspective view of an electrical test switch with a solidifying base according to a non-limiting example of implementation of the invention.
Figure 3:
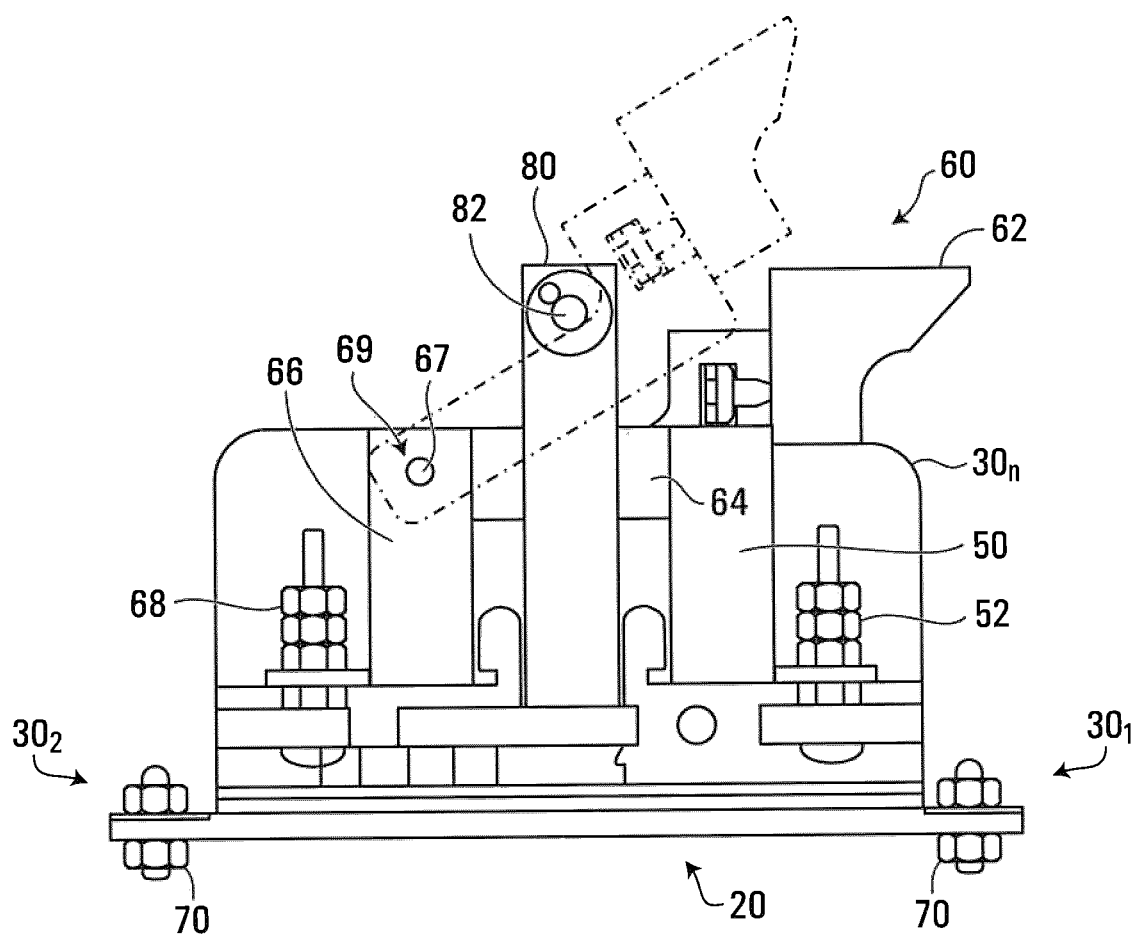
FIG. 3 is a side elevational view of the electrical test switch with a single pole-isolating barrier removed.

With reference to FIGS. 2 and 3, an example test switch 10 according to an embodiment of the present disclosure is shown. The test switch 10 comprises a body 15, a base 20, end covers 30$_{1,2}$, and a switch-fastening arrangement 70. The body 15 comprises a plurality of pole-isolating barriers 40$_{1-n}$, a handle assembly 50, and one or more pole connectors 60. In some embodiments, the body 15 may also include one or more short-circuit connectors 80. The body 15 is fastened to the base 20.

With reference to FIGS. 4A-B and 5A-B, the base 20 is a substantively-rectangular plate-like element having two generally parallel longitudinal sides 22 and two generally parallel transverse sides 24, each of which is perpendicular to both longitudinal sides 22. In some embodiments, the longitudinal sides 22 may be longer than the transverse sides 24, though in other embodiments, the transverse sides 24 may be longer than the longitudinal sides 22, or both the longitudinal sides 22 and the transverse sides 24 may have approximately equivalent lengths. The base 20 may be made of any suitable material, including rigid, electrically isolating plastics and sheet molding compounds, including, but not limited to, Bakelite™.

The base 20 also comprises an interlocking member 26 located in proximity to one of the longitudinal sides 22. The interlocking member protrudes from the base 20, and may comprise one or more steps. In the example of implementation shown in FIG. 4A, the interlocking member has two steps, one near the base of the interlocking member 26 and the other projecting from the step at the base. The interlocking member 26 may be formed as an integral component of the base 20, or may be attached to the base 20 via any suitable means, including fasteners or adhesives, etc.

The base 20 also includes a plurality of base apertures 28, which may be holes drilled or otherwise formed in the base 20. In some embodiments, the base apertures 28 may present threading suitable for receiving, for example, a screw or bolt. The base apertures 28 may include apertures that are in the center portion of the base, and also includes apertures that are located near the transverse edges of the base 24. The base apertures 28 in the center are used to mount the body 15 of the test switch to the base 20, while the base apertures 28 near the transverse edges 24 of the base 20 are used to secure the test switch 10 to a mounting surface, as will be explained in greater detail later.

With continued reference to FIGS. 4B and 5A, the end covers $30_{1,2}$ are rectangular plate-like elements disposed on top of the base 20 and running along opposite transverse ends 24 thereof. In some embodiments, the base 20 is provided with recesses along each of the transverse ends 24 suitable for receiving the end covers $30_{1,2}$, such that when the end covers $30_{1,2}$ are in place, the base 20 and end covers $30_{1,2}$ define a substantially flat surface. In other embodiments, the end covers $30_{1,2}$ may be raised vis-à-vis a top surface of the base 20, or may be lowered vis-à-vis the top surface of the base 20.

Each of the end covers $30_{1,2}$ includes a number of cover apertures 32, 34. One or more of the cover apertures 32, 34 may register with respective base apertures 28 formed near the transverse edges 24 of the base 20. The cover apertures 32, 34 are dimensioned to receive fasteners that extend through the entire base 20 and are provided to secure the base 20 to a mounting surface. Alternatively, some of the cover apertures 32, 34 are configured to receive fasteners to secure the end covers $30_{1,2}$ to the base 20. In this form of construction, the fasteners do not protrude from a lower surface of the base 20, the lower surface being opposite the top surface that receives the end covers $30_{1,2}$.

The end covers $30_{1,2}$ may be affixed to the base 20 via any suitable means, including fasteners, adhesives, and the like. The end covers $30_{1,2}$ may be formed of any suitable rigid material, including hard plastics, metals, such a steel, and the like.

With continued reference to FIG. 3, the switch-fastening arrangement 70 is used to secure the test switch 10 to a piece of external equipment, to an external surface, or to any other suitable object. The switch-fastening arrangement 70 secures the base 20 to the external equipment or surface independently from the fasteners used to fasten the body 15 to the base 20. Put differently, the fasteners used to fasten the body 15 to the base 20 are separate from those used to secure the test switch to the external equipment of surface. This may reduce or generally eliminate any stress induced on the body 15 by the fastening of the test switch 10 as a whole to the external equipment or surface.

The switch-fastening arrangement 70 includes fasteners, such as bolt-and-nut pairs, wherein each of the bolts is inserted through a respective one of the cover apertures 32, 34, through a respective one of the base apertures 28, and fastened to the external equipment/surface with the respective nut. The switch-fastening arrangement 70 may include two, four, six, eight, or any other suitable number of the aforementioned bolt-and-nut pairs. Additionally, while in the Figures, the switch-fastening arrangement 70 is substantially positioned around the transverse sides 24 of the test switch 10, other embodiments are also considered, and may feature the switch-fastening arrangement 70 being positioned along the longitudinal sides 22, or substantially centrally to the any of the longitudinal sides 22, the transverse sides 24, or to the test switch 10.

The method for assembling the test switch 10 generally involves fastening the body 15 to the base 20 by using fasteners which are inserted through one or more of the base apertures 28 (for instance those in the center of the base 20). The fasteners inserted into the base apertures 28 are torqued to specification at the factory in a controlled environment, thus avoiding creating stress in the body 15 of the test switch 10, in the event the body 15 of the test switch 10 is not entirely flat. Since the fasteners connecting the base 20 to the body 15 of the test switch 15 do not need to be accessed in the field, the relationship between the body 15 of the test switch 10 and the base 20 remains undisturbed during the useful life of the test switch 10. Advantageously, access to the fasteners connecting the base 20 to the body 15 of the test switch 10 may be made tamper proof, to prevent technicians in the field to attempt disassembly of the test switch 10 or re-torqueing of those fasteners. For example, fasteners with special head design that require non-standard tools can be used. Alternatively, the heads of the fasteners can countersunk in the lower surface of the base, and the recess filled with epoxy or any other suitable material such as to prevent removal of the fasteners.

In instances where the fasteners are indeed removed by a technician in the field who then attempts to re-assemble the test switch 10, the interlocking member 26 provides an abutment to prevent overstressing the body of the test switch 10 if the torque applied to the fasteners is not the recommended one. As shown in FIG. 2, the interlocking member 26 is received in a recess formed in the pole-isolating barrier $40_1$. The pole-isolating barrier $40_1$ is a structure that extends upwardly and as such it is substantially rigid in that direction, and is described in greater detail hereinbelow. When the base 20 is mounted to the body 15 of the test switch 10, the interlocking member 26 engages the recess and abuts against the bottom of the recess, thus preventing the body 15 from further flexing, which as indicated earlier, can cause the body 15 of the test switch 10 to crack. Accordingly, the interlocking member 26 is an element of safety to guard against improper disassembly and re-assembly of the test switch 10.

The examples of the test switch shown 10 in the drawings use a single interlocking member 26, but variants are possible. For example, multiple interlocking members 26 can be used, one for each pole-isolating barrier $40_{1,n}$. In this form of implementation, the interlocking members 26 are arranged in a spaced apart relationship on the base 20, the spacing between adjacent interlocking members 26 corresponding to the spacing between adjacent pole-isolating barriers $40_{1,n}$.

The test switch 10 is thus shipped from the factory with the base 20 and the body 15 assembled as a unit. When the test switch 10 is to be installed to the equipment or mounting surface where it is put in service, the installer only needs to fasten the bolts of the fastening arrangement 70. The torque to be applied to those bolts is not critical because the base 20 can take a significant loading without cracking or splitting, the end covers $30_{1,2}$ contributing to spread the load over a larger surface area.

Figure 6:
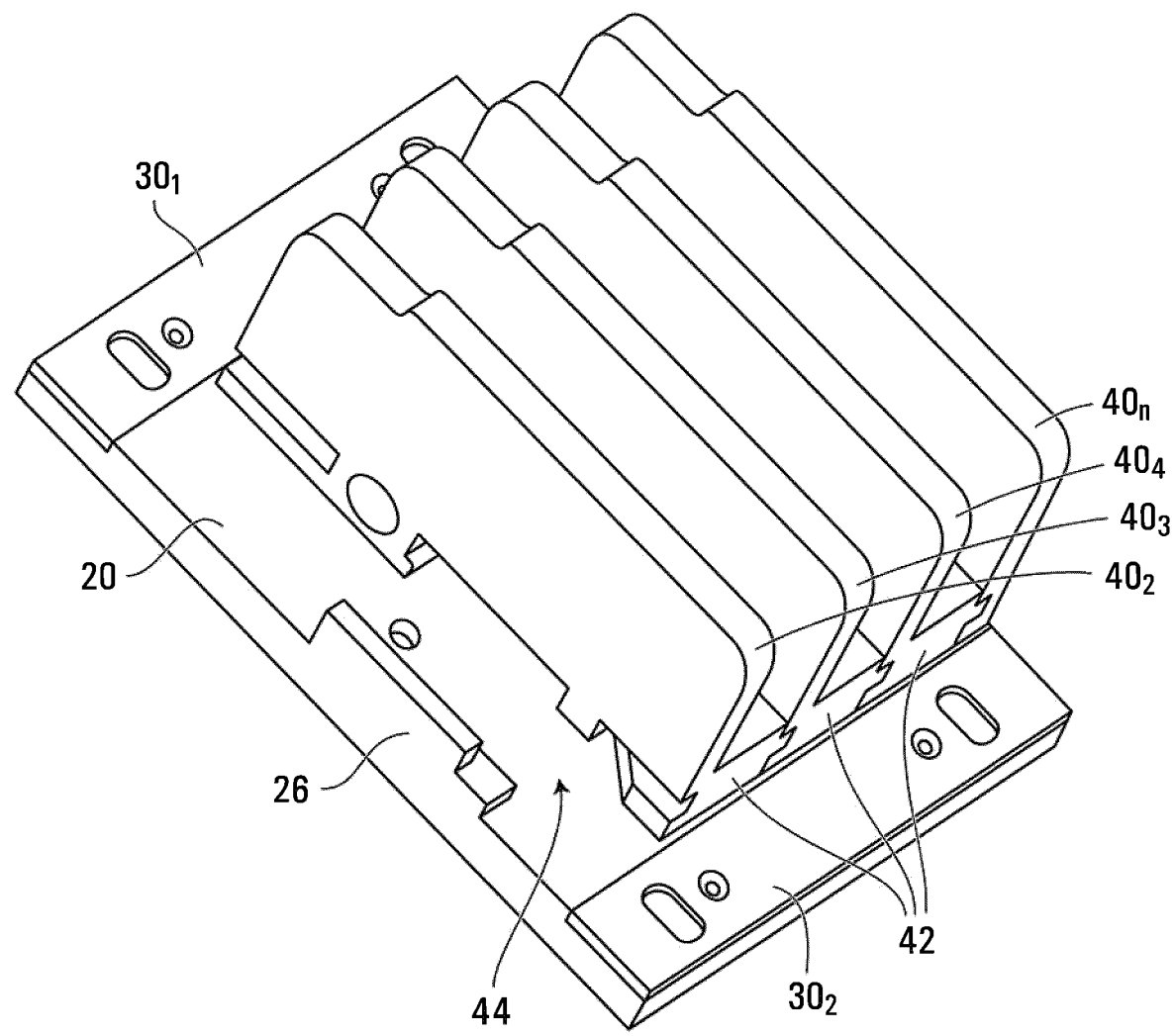
FIG. 6 is a perspective view of an assembly of the solidifying base and some of the pole-isolating barriers.

With reference to FIGS. 2 and 6, the body 15 further comprises the pole-isolating barriers $40_{1,n}$. The pole-isolating barriers $40_{1,n}$ are wall-like elements that are disposed along the longitudinal direction of the base 20. Additionally, the pole-isolating barriers $40_{1,n}$ typically span the length of the base 20, excluding the portions of the base 20 which are covered by the end covers $30_{1,2}$. The body 15 comprises at least two such pole-isolating barriers, but may alternatively comprise any number of pole-isolating barriers $40_{1,n}$. The pole-isolating barriers $40_{1,n}$ may be made of any suitable material, such as any suitably isolating material. This may include, for example, rigid plastics and bulk molding compounds, such as Bakelite™ or Premi-Ject®.

With continued reference to FIG. 6, at least some of the pole-isolating barriers $40_{1,n}$ may further comprise a connecting portion 42. Similarly, at least some of the pole-isolating barriers $40_{1,n}$ may have recess 44 which is adapted to receive the connecting portion 42 of an adjacent pole-isolating barrier $40_{1,n}$, thereby stacking one pole-isolating barrier $40_{1,n}$ against the aforementioned adjacent pole-isolating barrier $40_{1,n}$. For example, in FIG. 6, the pole-isolating barrier $40_1$, and its respective connecting portion 42 interlocks with the recess 44 of the pole-isolating barrier $40_2$, thereby securing pole-isolating barrier $40_1$ to pole-isolating barrier $40_2$. This connecting pattern repeats itself until the last pole-isolating barrier $40_n$. As the first pole-isolating barrier $40_1$ may be secured only to the base 20, it may not have a respective recess 44; similarly, as the last pole-isolating barrier $40_n$ need not itself secure any further pole-isolating barriers, it may not have a respective connecting portion 42.

The arrangement of pole-isolating barriers $40_{1,n}$ described earlier is modular and also forms a rigid assembly which is secured by fasteners to the base 20. The fasteners inserted through base apertures 28 of the base 20 which register with apertures through the connecting portions 42, such that the connecting portions are clamped against the base 20.

In embodiments where the body 15 comprises only two pole-isolating barriers $40_{1,n}$, they may be positioned along opposite longitudinal ends 22 of the base 20. In embodiments where the body 15 comprises more than two pole-isolating barriers $40_{1,n}$, two of the pole-isolating barriers $40_{1,n}$ may be positioned along opposite longitudinal ends 22 of the base 20, and the remaining barriers may be positioned therebetween, either at regular intervals or at irregular intervals. The positioning of the pole-isolating barriers $40_{1,n}$ is such that there is defined, between any two adjacent pole-isolating barriers $40_{1,n}$, a space or opening.

Figure 7A:
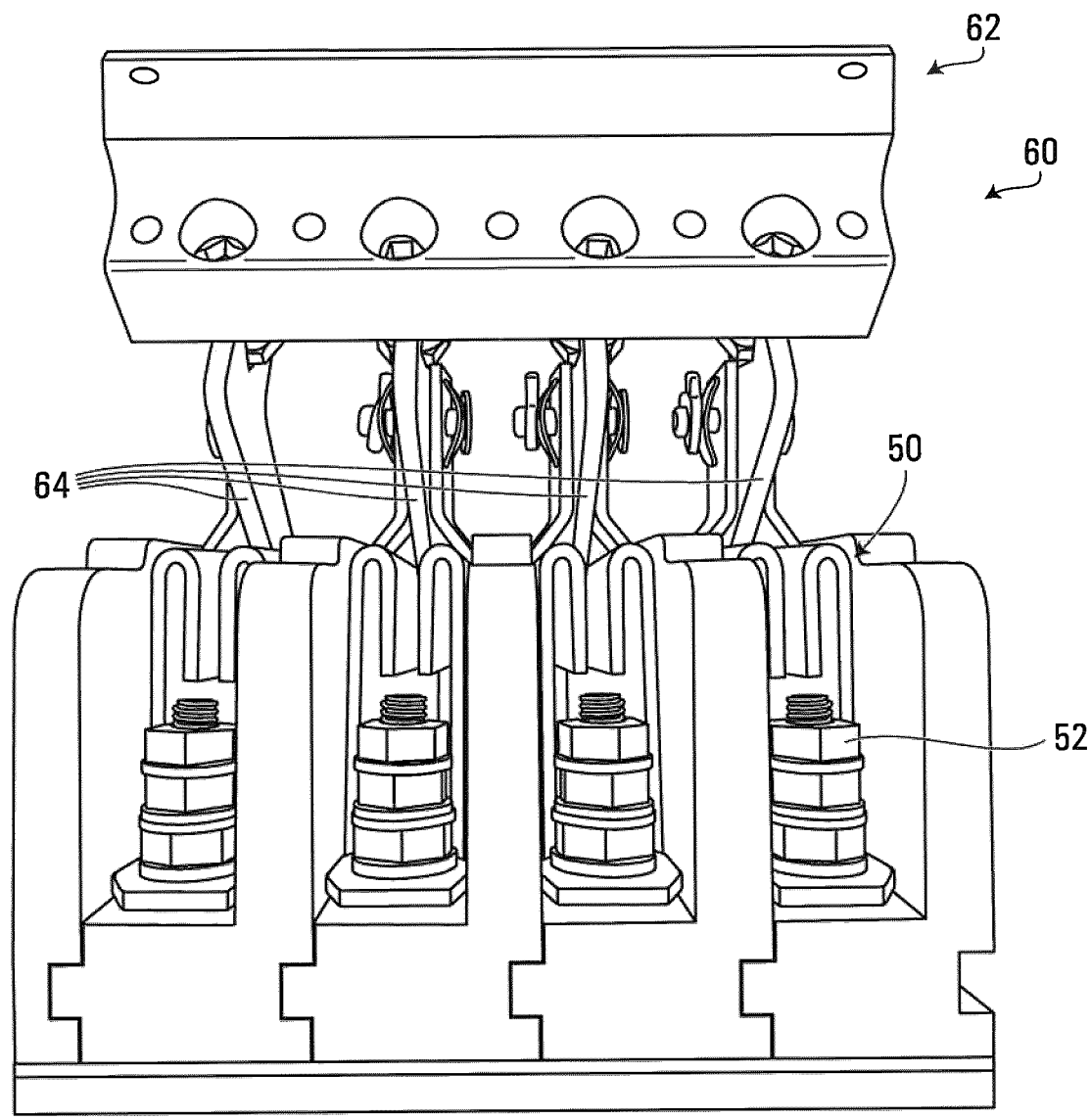
FIGS. 7A-B are close-up views of pole connectors with the test switch in opened and closed positions, respectively.
Figure 7B:
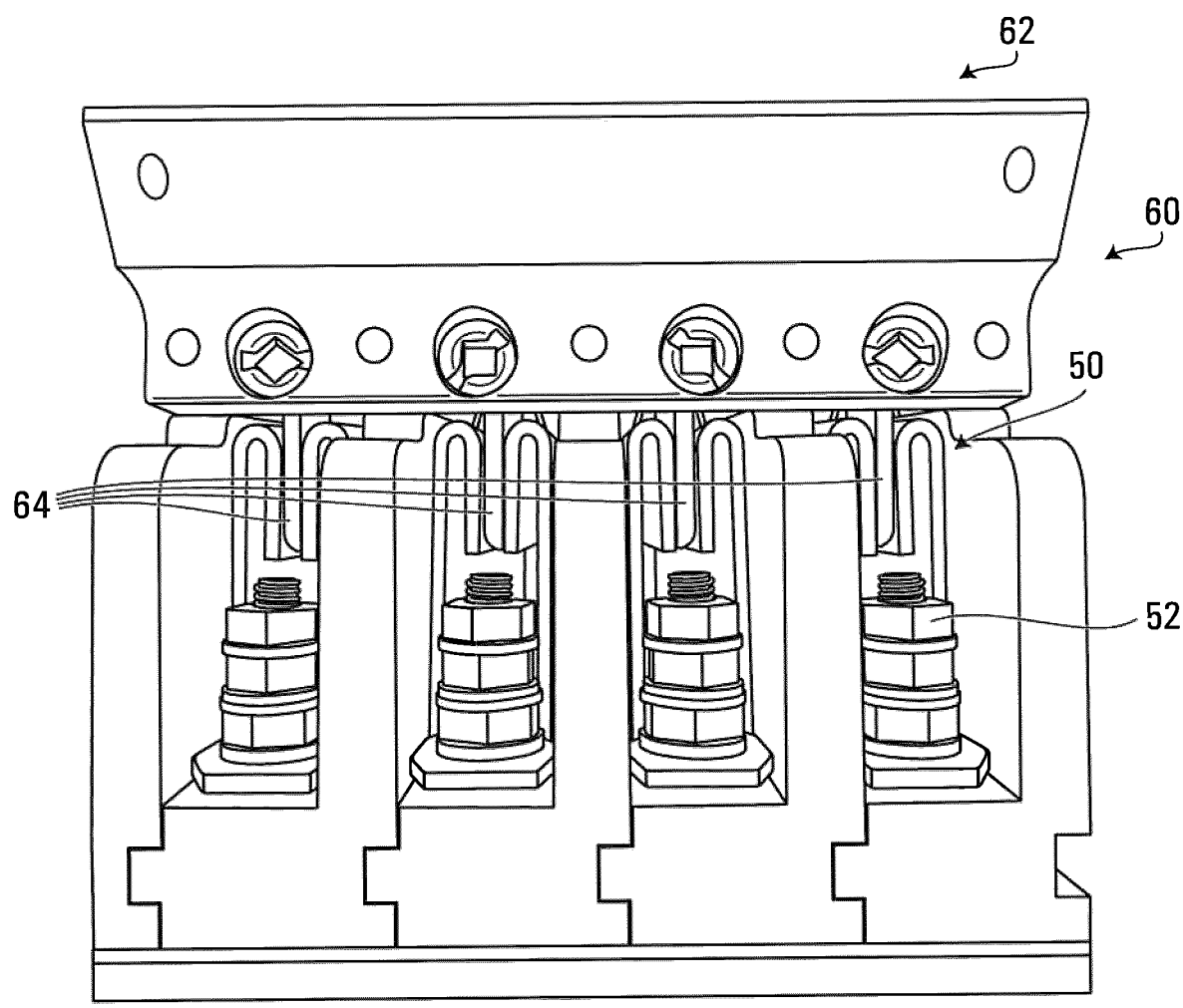

Referring again to FIG. 3, and with additional reference to FIGS. 7A-B, each of the openings so-defined by the pole-isolating barriers $40_{1,n}$ houses a respective pole connector 50, thereby defining a pole of the test switch 10. In general, a test switch 10 having n pole-isolating barriers $40_{1,n}$ (where n is any number greater than two) will have n-1 poles. The particular implementation of an example pole connector 50 will be described later in greater detail; however, the body 15 comprises, for each respective one of the pole connectors 50, a respective pole terminal 52, which allows the test switch 10 to be connected to external electrical test equipment (not pictured) and is in electrical contact with its respective pole connector 50. Generally speaking, the pole terminals will be connected to test equipment, though other embodiments are also considered.

Each of the pole terminals 52 may be implemented in any suitable fashion, including screw terminals, plug-in terminals, and the like. Each of the pole connectors 50 and their respective pole terminals 52 may be secured to the base 20 and/or to their respective pole-isolating barrier 40 by any suitable means, including fasteners, adhesives, and the like. In some embodiments, each of the pole connectors 50 may be secured to the rest of the test switch 10 by way of their respective pole terminals 52.

Figure 8:
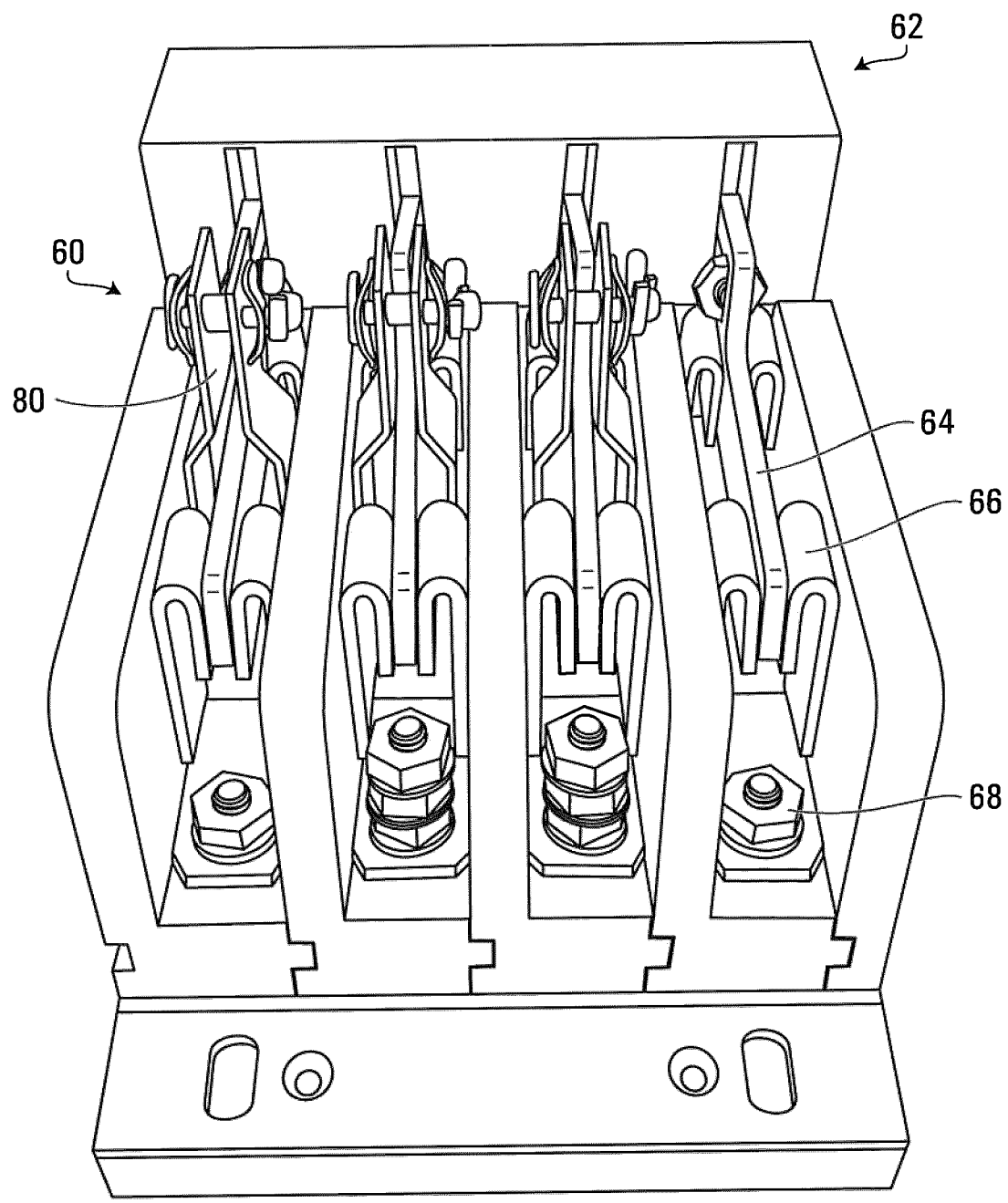
FIG. 8 is a front view of the electrical test switch, with a close-up view of terminal connectors.

With continuing reference to FIG. 3 and additional reference to FIG. 8, the test switch 10 further comprises a handle assembly 60, which comprises a handle 62, one or more lever arms 64, one or more lever connector 66, and one or more respective lever terminal 68. The handle 62 allows an operator of the test switch 10 to cause the handle assembly 60 to rotate, alternating between at least two positions, including a raised, opened position, and a lowered, closed position. To this end, the handle 62 may be formed of any suitable isolating material, and may have any suitable shape, such that the handle 62 may be easily manipulated by an operator of the test switch 10. The body 15 comprises as many lever arms 64, lever connectors 66, and lever terminals 68 as there are poles in the test switch 10. Thus, as described above, a test switch having n pole-isolating barriers $40_{1,n}$ (where n is any number greater than two) will have n-1 poles, and thus n-1 lever arms 64, lever connectors 66, and lever terminals 68. Similarly to the pole connectors 50, each opening defined by two adjacent pole-isolating barriers $40_{1,n}$ will have one respective lever arm 64, lever connector 66, and lever terminal 68.

Figure 10:
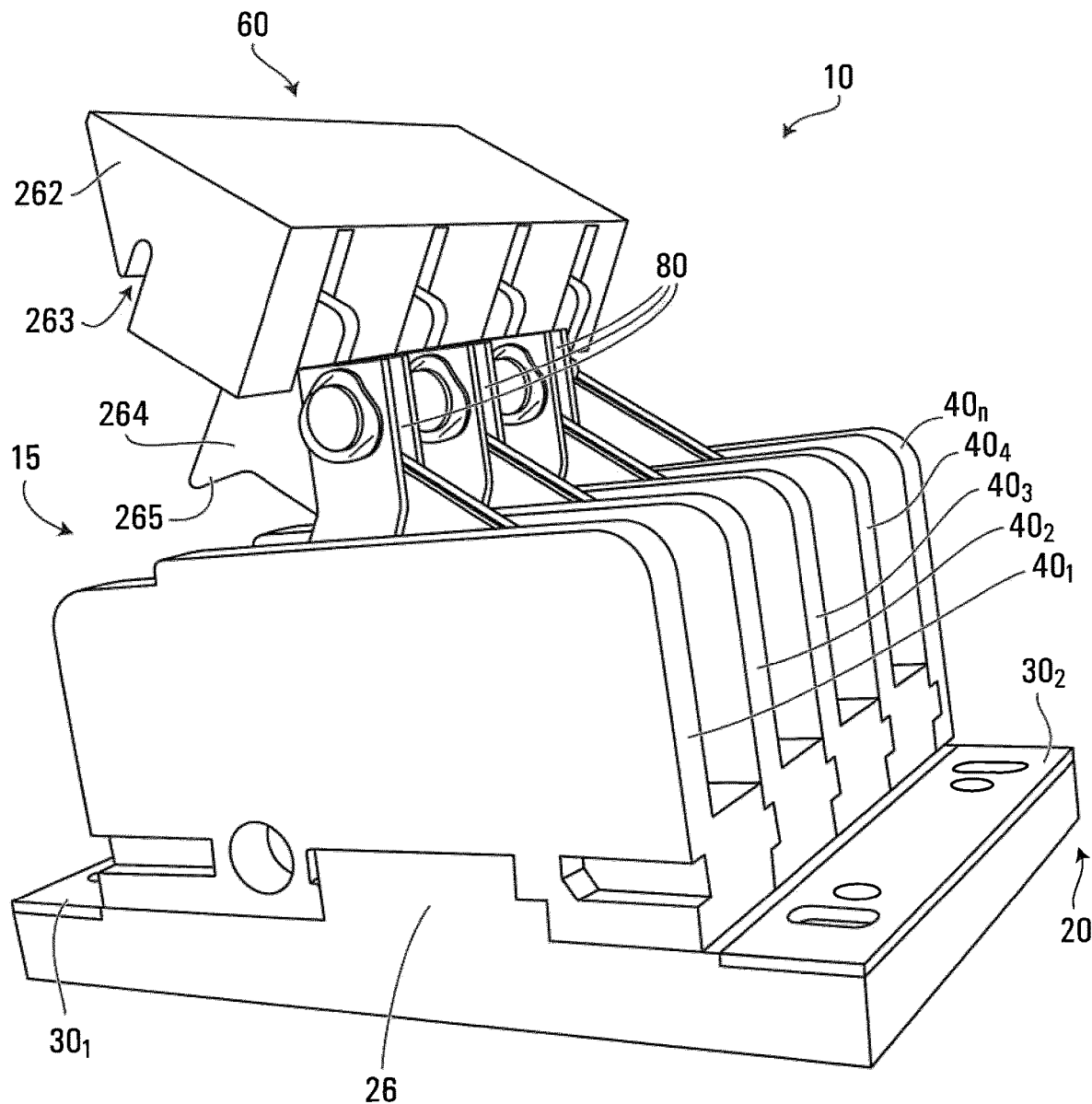
FIG. 10 is a perspective view of the test switch with the solidifying base according to a variant.
Figure 11:
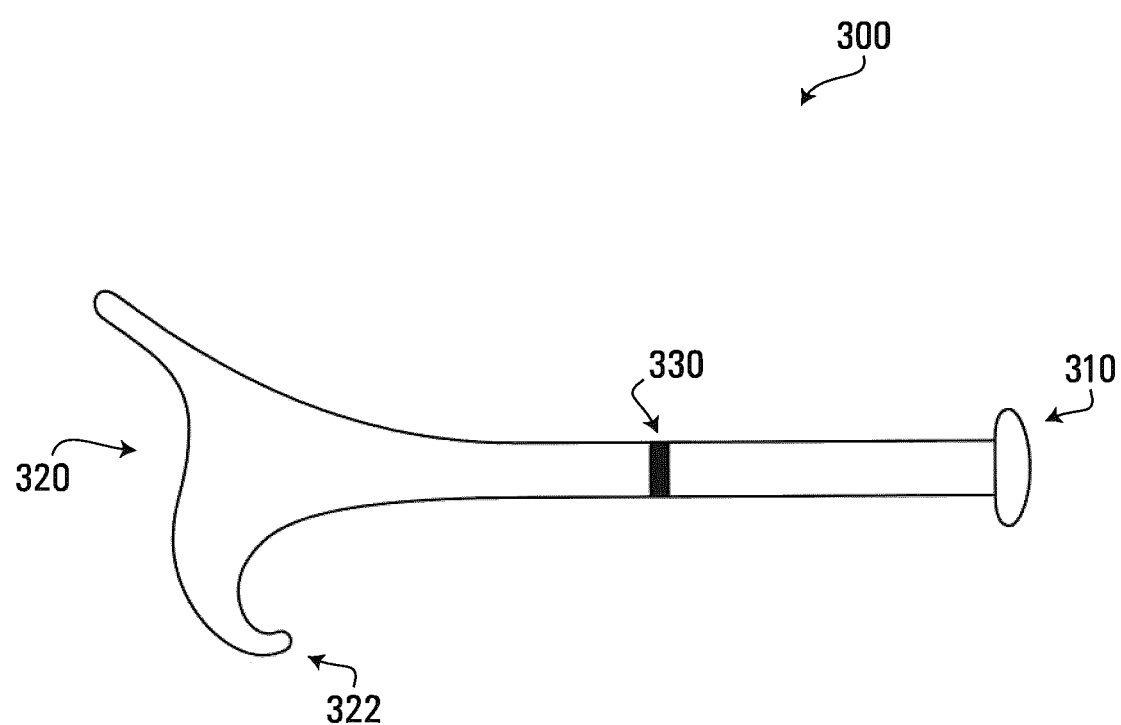
FIG. 11 is a side view of a pull bar with a spring mechanism.

With reference to FIGS. 10 and 11, an alternate embodiment of the handle assembly 60 may have a handle 262, which, while substantially similar to handle 62, may additionally comprise one or more notches or recessed portions 263. The recessed portions 263 are configured for mating with an interlocking portion 322 at an end portion 320 of a pull bar 300, which may be used by a user of the test switch 10 to operate the handle 262, namely to rotate between the opened position and the closed position. Alternatively, the handle 262 may comprise one or more hooks (not pictured) which may also be configured for mating with the end portion 320 of the aforementioned pull bar 300. The pull bar 300 allows operating the handle without the need of actually touching the handle directly, which is safer and reduces the risks of electrocution.

With continued reference to FIG. 11, the pull bar 300 is generally elongated rod or bar of any suitable length, and made of one or more materials, which are electrically-isolating materials, such as wood, plastic, and the like. The pull bar 300 comprises a handle 310 at one end thereof, and the aforementioned end portion 320 at an opposite end thereof. Handle 310 has an enlarged end section to prevent the hand of the user that holds the bar, from slipping.

The pull bar 300 may also has a protection mechanism 330 positioned generally between both ends to prevent the application excessive force to the handle assembly 60 of the test switch 10. There may be instances where the handle assembly 60 of the test switch 10 is stuck and excessive force applied to the handle assembly 60 to move it may damage the handle assembly 60, the test switch 10, or both. The pull bar 300 with such protection mechanism 330 is designed to limit the degree of force applied to the handle assembly 60 to a safe level or at least to warn the technician that a limit has been reached. The protection mechanism 330 can have different forms of implementation.

A first possibility is to make a portion of pull bar 300 of a material designed to break when a certain level of tensile force is reached. The level of tensile force is selected such as to be below or at the maximal level of strain that the handle assembly 60 of the test switch 10 can bear. Accordingly, if the handle assembly 60 is stuck and the technician continues to increase the force on the handle assembly 60, the pull bar 300 will break apart preventing damage to test switch 10. In a specific example, the protection mechanism 330 can be made by narrowing the cross-section of the handle 310 of the pull bar 300 such that it will break when a preset level of tensile force is applied.

Another possibility is to make the pull bar 300 of two parts that separate when a certain level of tensile force is reached but in a non-destructive fashion, such that after separation the components can be re-assembled and the pull bar 300 is suitable for further use. For example, the two components may be designed such that one has a cavity and other a projection matingly received in the cavity. The projection has a detent, such as a spring loaded detent that releases at a predetermined level of tensile force. For example, the test switch 10 may be configured to withstand up to 50N of force applied to the handle 262; applying a force greater than 50N may in turn result in damage to the test switch 10. In this example, the detent mechanism of the pull bar 300 may be configured to cause the pull bar 300 to separate when the pulling force of 50N or more is applied thereto.

If the pull bar 300 separates in case of excessive force, it can be re-assembled by forcibly inserting the projection into the recess. Additionally, the user may be capable of voluntarily disassembling and reassembling the pull bar 300, for example when the pull bar 300 is to be placed in storage.

Another possible embodiment of a protection mechanism is the use of a strain gage that electronically measures the tensile strength applied to the handle assembly 60 of the test switch 10. The strain gage is used to warn the user that the force limit has been reached. An audible, visible, or haptic alarm can be used to warn the user. It should be noted that in this embodiment, the pull bar 300 will not release the handle 310 when the limit is reached; the pull bar 300 will only provide a warning to the user.

With continuing reference to FIGS. 3 and 8, an exemplary lever arm 64 may be implemented as an L-shaped plate of conductive material. With reference to FIG. 10, in some embodiments, an alternate lever arm 264 may also comprise a lobed portion 265. The lever arm 64 (or 264) may be retained in the handle 62 (or 262) by any suitable means, including fasteners, adhesives, and the like, which retain the lever arm 64 (or 264) by a first end thereof. In some embodiments, the lever arms 64 (or 264) may be retained in the handle 62 (or 262) by being molded therein. The lever arm 64 (or 264) may also define an aperture in an opposite end thereof suitable for receiving a retaining pin 67. As the lever arms 64 (or 264) may carry current, the handle 62 (or 262) is made of a suitably electrically-isolating material, as mentioned previously.

The lever connector 66 and lever terminal 68 are implemented in analogous fashion as the pole connector 50 and pole terminal 52, which will be explained in greater detail below. Each of the lever terminals 68 allows the test switch to be connected to power distribution electrical equipment and is in electrical contact with its respective lever connector 66. Each of the lever terminals 68 may be implemented in any suitable fashion, including screw terminals, plug-in terminals, and the like. Each of the lever connectors 66 and their respective lever terminals 68 are secured to the base 20 and/or to their respective pole-isolating barrier 40 by any suitable means. In some embodiments, the lever connectors 66 are secured to the test switch 10 by way of their respective lever terminals 68. Additionally, the lever connectors 66 may present one or more apertures 69 suitable for receiving the retaining pin 67, and a respective lever arm 64 (or 264) may be positioned so as to be retained in contact with a respective lever connector 66 by way of the retaining pin 67.

With continued reference to FIGS. 7A-B, 8, 19A-B, and 21A-B, the pole connectors 50 and the lever connectors 66 are implemented as a pair of hook-shaped plates, spaced apart from one another, thereby defining a gap, and connected at their base. In an alternative embodiment, the pole connectors 50 and the lever connectors 66 may simply be a pair of angled plates. The gap between the hook-shaped plates may generally be somewhat smaller than a thickness of the lever arms 64 (or 264), such that when the handle assembly 60 is rotated into the closed position, a respective lever arm 64 (or 264) comes into contact with and pushes the two hook-shaped plates apart slightly. Placing the test switch 10 in the closed position creates a number of electrical paths (equal to the number of poles) spanning from the lever terminals 68 to respective pole terminals 52. This effectively "closes" the circuit between each of the test equipment connected at respective pole terminals 52 and power distribution electrical equipment connected at respective lever terminals 68. Thus, in FIG. 7A, the power distribution electrical equipment is disconnected from the test equipment; conversely, in FIG. 7B, the power distribution electrical equipment is connected to the test equipment via the respective electrical paths.

As mentioned previously, the lever connectors 66 and the lever terminals 68 are implemented in analogous fashion to the pole connectors 50 and the pole terminals 52, respectively. That is to say, the pole connectors 50 and the lever connectors 66 may each be implemented as a pair of hook-shaped plates, spaced apart from one another, thereby defining a gap, and connected at their base. These hook-shaped plates are made of any electrically-conductive material, and are electrically communicative with their respective pole terminal 52 or lever terminal 68. Additionally, as mentioned previously, the hook-shaped plates of each of the lever connectors 66 may present one or more apertures 69 suitable for receiving a retaining pin 67 for securing a respective one of the lever arms 64 between the two hook-shaped plates of a respective lever connector.

With reference to FIG. 3, some embodiments of the body 15 may further comprise one or more short-circuit connectors 80. Each of the short-circuit connectors 80 is implemented as a pair of bent plates of conductive material, spaced apart from each other, and connected at a bottom portion thereof, where they are secured to the base 20 or to a respective connection portion 42 of a respective pole-isolating barrier 40, and may further be connected at a top portion thereof, by way of retaining pin 82. Each of the short-circuit connectors 80 electrically communicates with the other short-circuit connectors, and may further be connected to one of the lever terminals 68. The gap between the two bent plates may be larger near their bottom portion and smaller near their top portion; more specifically, the gap between the two bent plates at their top portions may generally be somewhat smaller than a thickness of the lever arms 64 (or 264) such that when the handle assembly 60 is rotated into the opened position, a respective lever arm 64 (or 264) comes into contact with and pushes the two bent plates apart slightly. When the handle of the test switch is thus raised, as shown for example in FIG. 2, the opened position short-circuits the test switch 10, such that the lever terminals 68 are connected to one another, effectively bypassing the test switch 10 and removing any connections to the test equipment connected at the pole terminals 52.

Embodiments of the test switch 10 which comprise the short-circuit connectors 80 generally comprise one fewer short-circuit connector 80 than the number of poles. Thus, such a test switch 10 having n pole-isolating barriers $40_{1,n}$ (where n is any number greater than two) will have n-1 poles, and n-2 short-circuit connectors 80. Thus, in general, test switches 10 having less than two poles will generally not comprise any short-circuit connectors 80.

As discussed previously, the test switch 10 may acquire one of two operative states or positions, namely a closed position and an opened position. In the opened position, the handle 62 (or 262) is in a raised position, and if the particular embodiment of the test switch 10 includes the short-circuit connector 80, the lever arms 64 (or 264) will cause the power distribution electrical equipment connected at the lever terminals 68 to be short-circuited through the test switch 10. In this position, the test equipment connected to the terminals 68 is disconnected from the power distribution electrical equipment. The test equipment can then be safely removed from the power distribution electrical equipment since no voltage is impressed on the terminals 52. Note that in the arrangement using the short-circuit connector 80, the test switch 10 is configured such that as the handle 62 (or 262) is raised, the short-circuit connection is established before the lever arms break contact with the pole connectors 50.

When the handle 62 (or 262) is in the closed position, the lever arms 64 (or 264) bridge the terminals 68 and 52, establishing an electrical connection between the power distribution electrical equipment and the test equipment.

Figure 9:
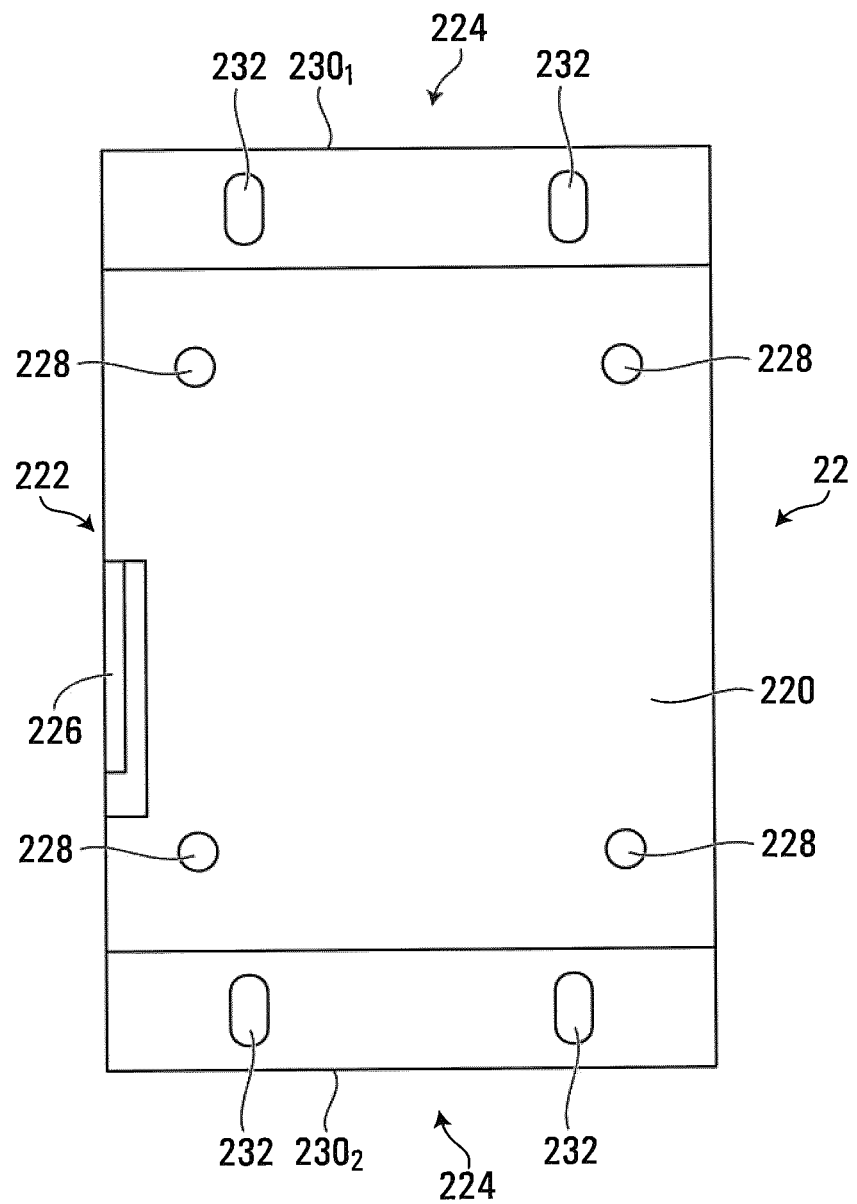
FIG. 9 is a top view of the solidifying base according to a variant.

With reference to FIG. 9, an alternative base 220 for the test switch 10 may have longitudinal sides 222 and transverse sides 224. In many embodiments, including those depicted in FIG. 9, the longitudinal sides 222 may be longer than the transverse sides 224, though in other embodiments, the transverse sides 224 may longer than the longitudinal sides 222, or both the longitudinal sides 222 and the transverse sides 224 may have approximately equivalent lengths. The base 220 may be built of any suitable material, including rigid, isolating plastics and sheet molding compounds, including, but not limited to, Bakelite™.

The alternative base 220 also comprises an interlocking member 226 located in proximity to one of the longitudinal sides 222. The interlocking member 226 protrudes from the base 220. The interlocking member 226 may be formed as an integral component of the base 220, or may be attached to the base 220 via any suitable means. The base 220 also includes a plurality of base apertures 228, which may be holes drilled or otherwise formed in the base 20. In some embodiments, the base apertures 228 may present threading suitable for receiving, for example, a screw or bolt.

This embodiment of the test switch 10 may further comprise alternative end covers $230_{1,2}$ arranged substantially similarly to the end covers $30_{1,2}$, but may only comprise first apertures 232, which may be aligned with the base apertures 228 of the alternative base 220.

With reference to FIGS. 34 to 36, an alternative base 620 for the test switch 10 may have longitudinal sides 622 and transverse sides 624. The base 620 may be built of any suitable material, including rigid, isolating plastics and sheet molding compounds, including, but not limited to, Bakelite™.

The alternative base 620 comprises an interlocking member 626 located in proximity to one of the longitudinal sides 622. The interlocking member 226 protrudes from the base 220. The interlocking member 626 may be formed as an integral component of the base 620, or may be attached to the base 620 via any suitable means. The base 620 also includes a plurality of base apertures 628, which may be holes drilled or otherwise formed in the base 620. In some embodiments, the base apertures 628 may present threading suitable for receiving, for example, a screw or bolt. The base 620 also comprises apertures 628 which are dimension to receive fasteners for securing the base 620 to the remainder of the test switch 10 (e.g., the pole-isolating barriers). In the particular embodiment shown, the apertures 628 are counter-bored holes defining a shoulder in which a head of a fastener can be disposed such as to allow the base 620 from contacting the mounting surface of the equipment.

The base 620 does not comprise end covers such as the end covers $30_{1,2}$ previously described. Rather, the base 620 comprises apertures 634 dimensioned to receive fasteners for securing the base 620 to a mounting surface. Specifically, in the illustrated embodiment, the apertures 634 are counter-bored holes defining a shoulder in which a head of a fastener 655 can be disposed such as to allow the pole-isolating barriers to contact the base 620 and be attached thereto. In particular, the apertures 634 are counterbored from a top surface of the base 620 to a bottom surface of the base 620 which faces the mounting surface of the equipment when the test switch 10 is secured to the equipment. In some cases, this configuration of the base 620 may allow the test switch 10 to be more compact.

With reference to FIGS. 12 to 16, the test switch 10 may be configured for coupling to a locking device. The locking device is an enclosure substantially covering all or part of the test switch 10, to prevent unauthorized access to the test switch 10, including to the pole terminals 52 and/or to the lever terminals 68, or to prevent a user from operating the handle assembly 60.

Figure 12:
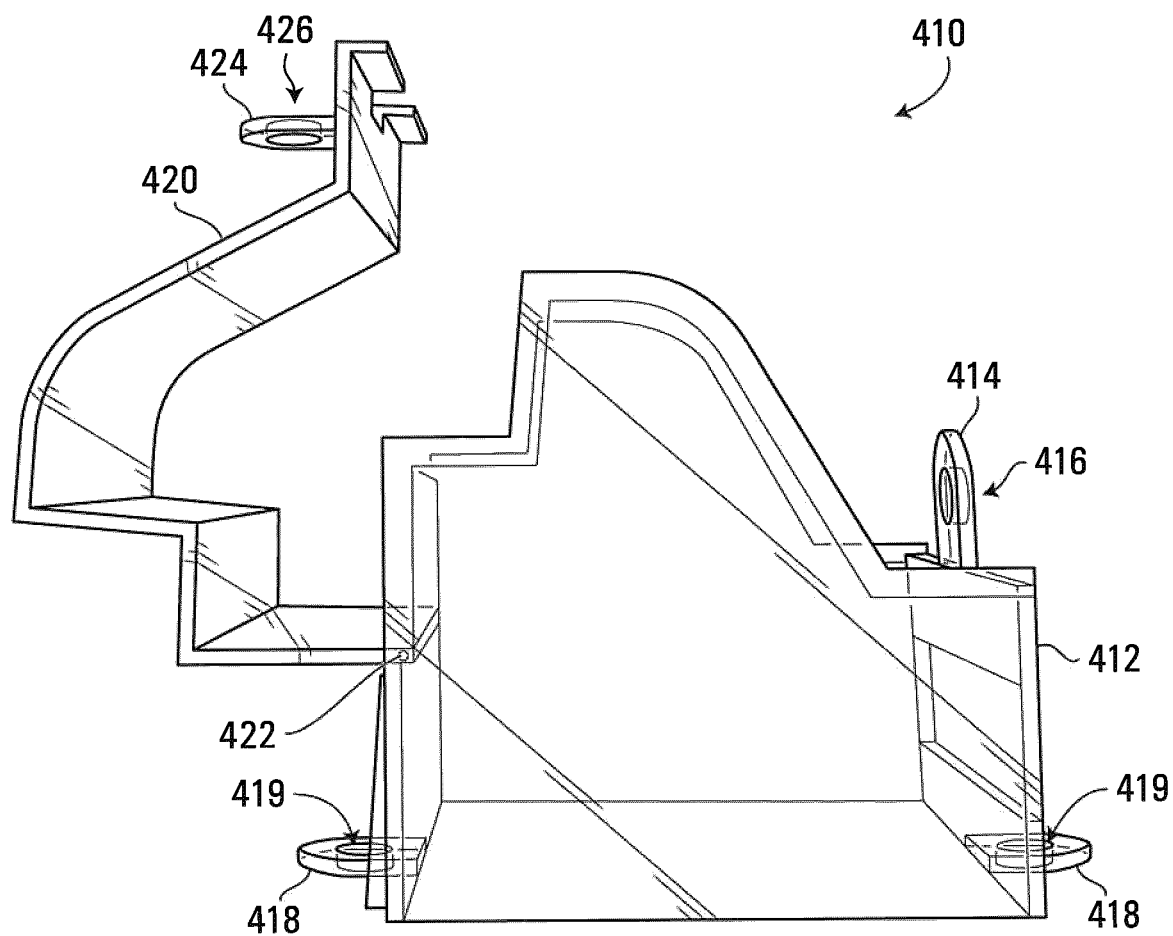
FIG. 12 is a side elevational view of an enclosure for the test switch that locks the test switch in a certain operative position.
Figure 13A:
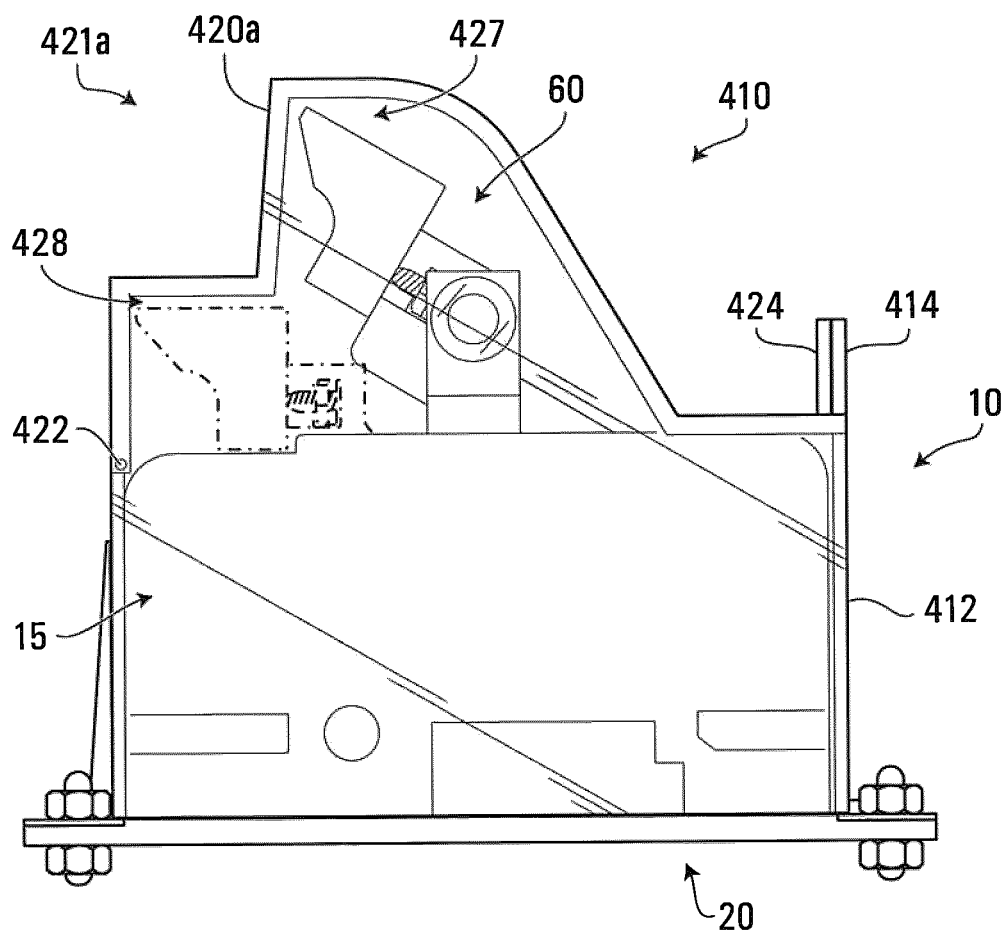
FIG. 13A is a side elevational view of the enclosure of FIG. 12, showing the test switch disposed therein.
Figure 13B:
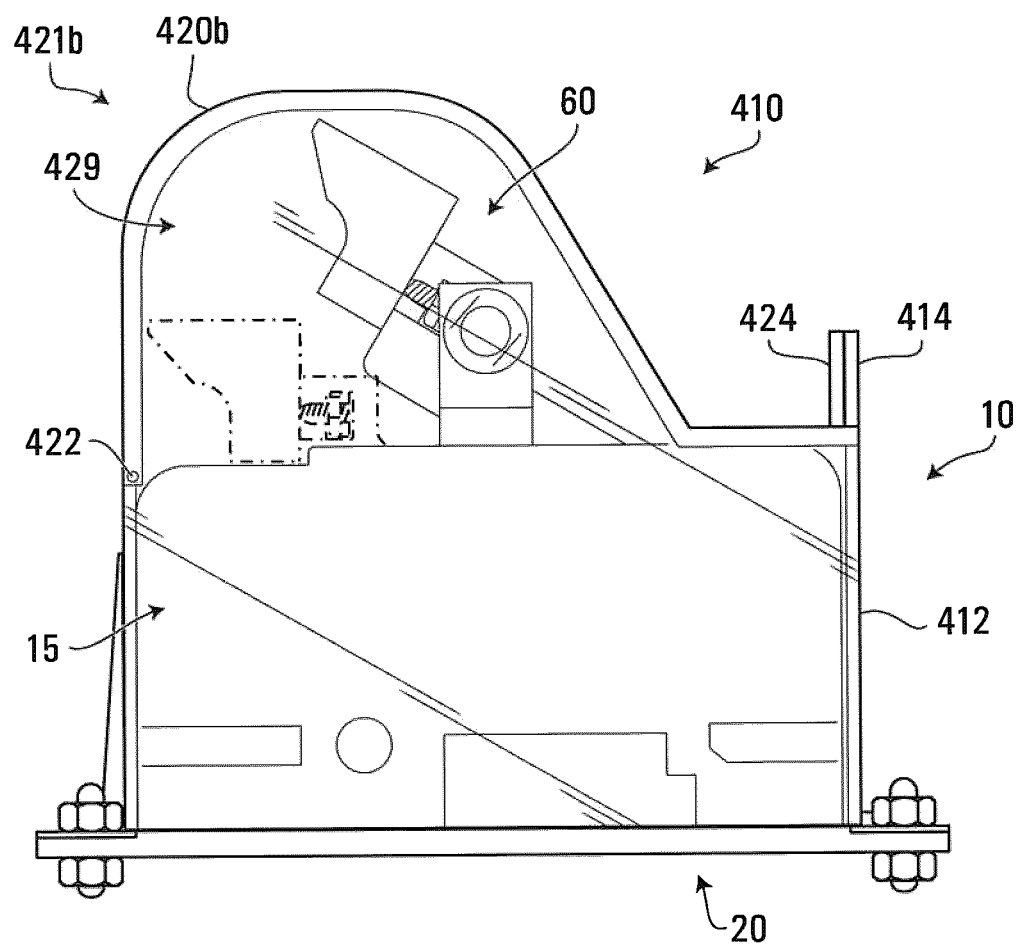
FIG. 13B is a side elevational view of the enclosure of FIG. 12 showing the test switch disposed therein, according to a variant.
Figure 14A:
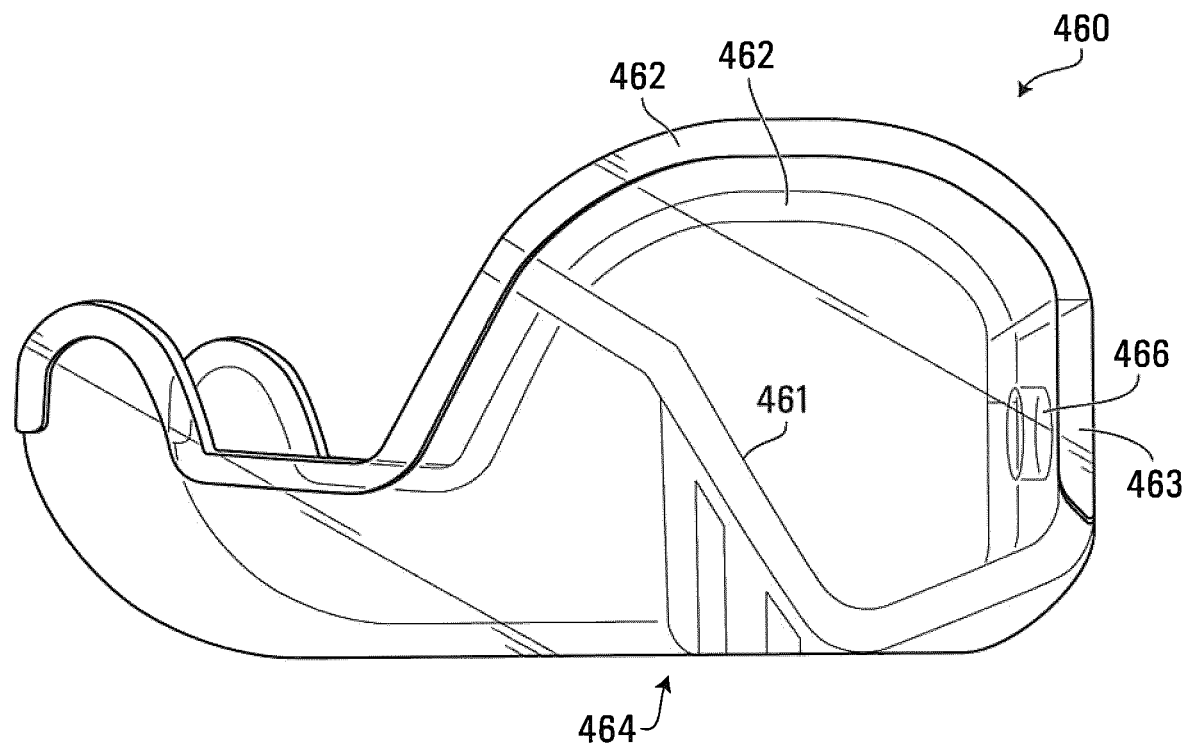
FIG. 14A-B are side elevational views of a handle locking device base and cover, respectively.
Figure 14B:
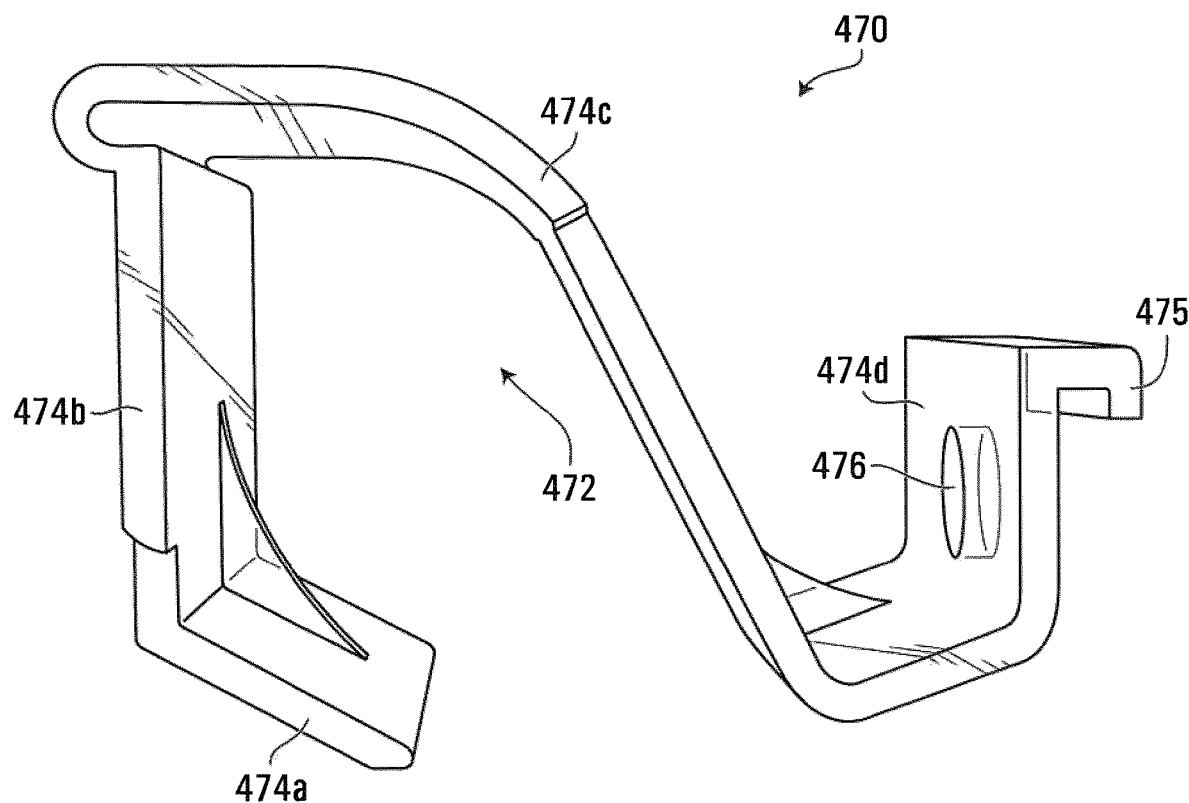
Figure 15:
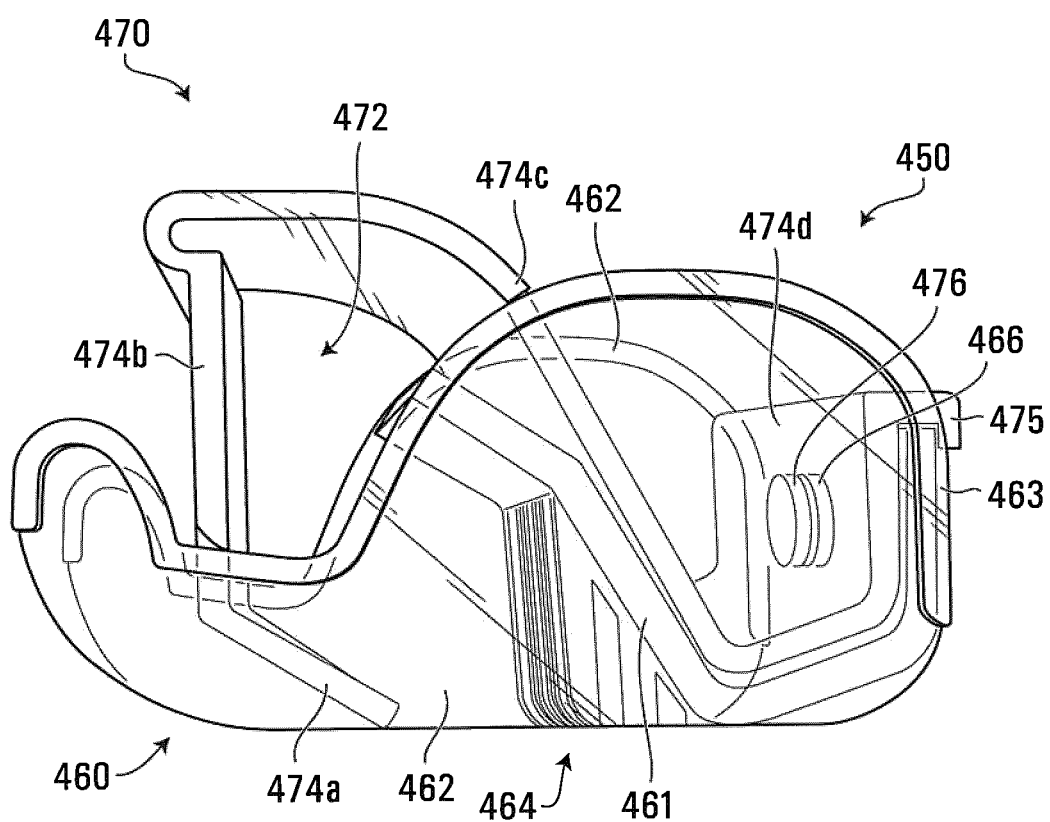
FIG. 15 is a side elevational view of the handle locking device, showing the base and the cover assembled.

With reference to FIGS. 12 and 13A-B, the locking device comprises an enclosure 410 which is designed to receive the test switch 10. The enclosure 410 comprises a body portion 412 and a moveable cover portion 420a or 420b. The body portion 412 is shaped so as to accommodate the body 15 of the test switch 10. The body portion 412 has two major generally opposite side walls and two minor also generally opposite side walls. The body portion 412 has no bottom wall, thus allowing the box formed by the major and minor side walls to be slipped over the test switch. One of the minor side walls has a vertically projecting locking flange 414, which comprises an aperture 416.

The minor side walls further include projecting flaps 418 with apertures which register with the cover apertures 34. The enclosure 410 may then be mounted to the test switch, by placing the enclosure over the test switch such that apertures 419 line-up with the apertures 34 and then inserting fasteners to secure the enclosure 410 to the base 20.

The cover portion 420a,b is attached to the body portion 412 via a hinge 422, and also includes a locking flange 424, which also comprises an aperture 426. The cover portion 420a,b may assume one of a plurality of positions, including a closed position, wherein the cover portion 420a,b is resting on the body portion 412, and an opened position (shown in FIG. 12) wherein the cover portion is rotated away from the closed position, thereby exposing the interior of the body portion 412. When the cover portion 420a,b is in the closed position, the enclosure 410 prevents operation of the handle assembly 60 and also prevents a user from accessing the pole terminals 52 and/or lever terminals 68. Conversely, when the cover portion is rotated to the opened position, the handle assembly 60, the pole terminals 52, and lever terminals 68 are accessible.

When the cover portion 420a,b is in the closed position, as shown in FIG. 13A-B, the locking flanges 414, 424, on the body portion 412 and the cover portion 416, line-up, allowing a lock to be placed to prevent the cover portion 420a,b from being opened.

With continued reference to FIG. 13A, the cover portion 420a is configured so as to prevent the handle assembly 60 from be operated, whether the handle assembly 60 is in the closed position or in the opened position. The cover portion 420a is thus designed to accommodate the handle assembly 60 in either one of the closed position or the opened position, but not in between. FIG. 13A shows the relationship between the cover portion 420a and the handle assembly 60 when the latter is in the opened position, as well as in the closed portion, in the dotted lines. Specifically, when raised, the handle assembly 60 fits in the upper cavity 427 of the cover portion 420a. The cover portion 420 also defines a lower cavity 428 configured to receive the handle assembly 60 when the latter is in the closed position, as shown by the dotted lines.

With reference to FIG. 13B, the cover portion 420b is also configured so as to prevent the handle assembly 60 from being operated, whether the handle assembly 60 is in the closed position, in the opened position, or in any intermediary position. The cover portion 420b is thus designed to accommodate the handle assembly 60 in a plurality of positions, including the opened position, the closed position, or any position therebetween. FIG. 13B shows the relationship between the cover portion 420b and the handle assembly 60 when the latter is in the opened position, as well as in the closed portion, in the dotted lines. Specifically, the cover portion 420b defines a cavity 429 which can receive the handle assembly 60 in any number of positions in between (and including) the opened position and the closed position (as shown by the dotted lines).

With reference to FIGS. 14A-B, 15, and 16, another embodiment of the locking device will now be described. This embodiment includes an enclosure 450 which is smaller than the enclosure 410 and it is designed to cover only the handle assembly 60 of the test switch, not the body 15 thereof. The enclosure 450 includes a base portion 460 and a cover portion 470. The base portion 460 comprises a pair of generally parallel side walls 462 joined at the rear by a rear wall 463 which, at its lower end curves back to form an internal partition 461 that extends upwardly between the side walls 462. The base portion 460 defines a void area 464 dimensioned to accommodate the handle assembly 60 of the test switch 10. The void area 464 is configured to allow the base portion 460 to be slipped over the handle assembly 60 when the handle assembly 60 is in the opened position. The base portion 460 has a flat bottom and it is configured to rest on one or more of the pole-isolating barriers $40_{1,n}$. The base portion 460 also comprises an aperture 466 on the rear wall 463 to lock the cover portion 470 to the base portion 460, as it will be described hereinafter.

The cover portion 470 is configured to be received into the base portion 460 and to interlock with the handle assembly 60 such as to prevent tampering with the handle assembly 60. The cover portion 470 includes a cavity 472 formed by one or more cavity wall segments 474 a-d. More specifically, the cover portion 470 includes a lower, oblique wall segment 474a that fits under the handle assembly 60 when the handle assembly 60 is in the opened position. A generally upstanding wall segment 474b extends from the oblique wall segment 474a, and then merges with a curved, descending wall segment 474c. The latter terminates with an upstanding wall segment 474d which runs parallel to the rear wall of the base portion 460 and defines an aperture 476. Note that the wall segment 474d has a hook-shaped edge 475 which receives the upper edge of rear wall of the base portion 460.

Figure 16:
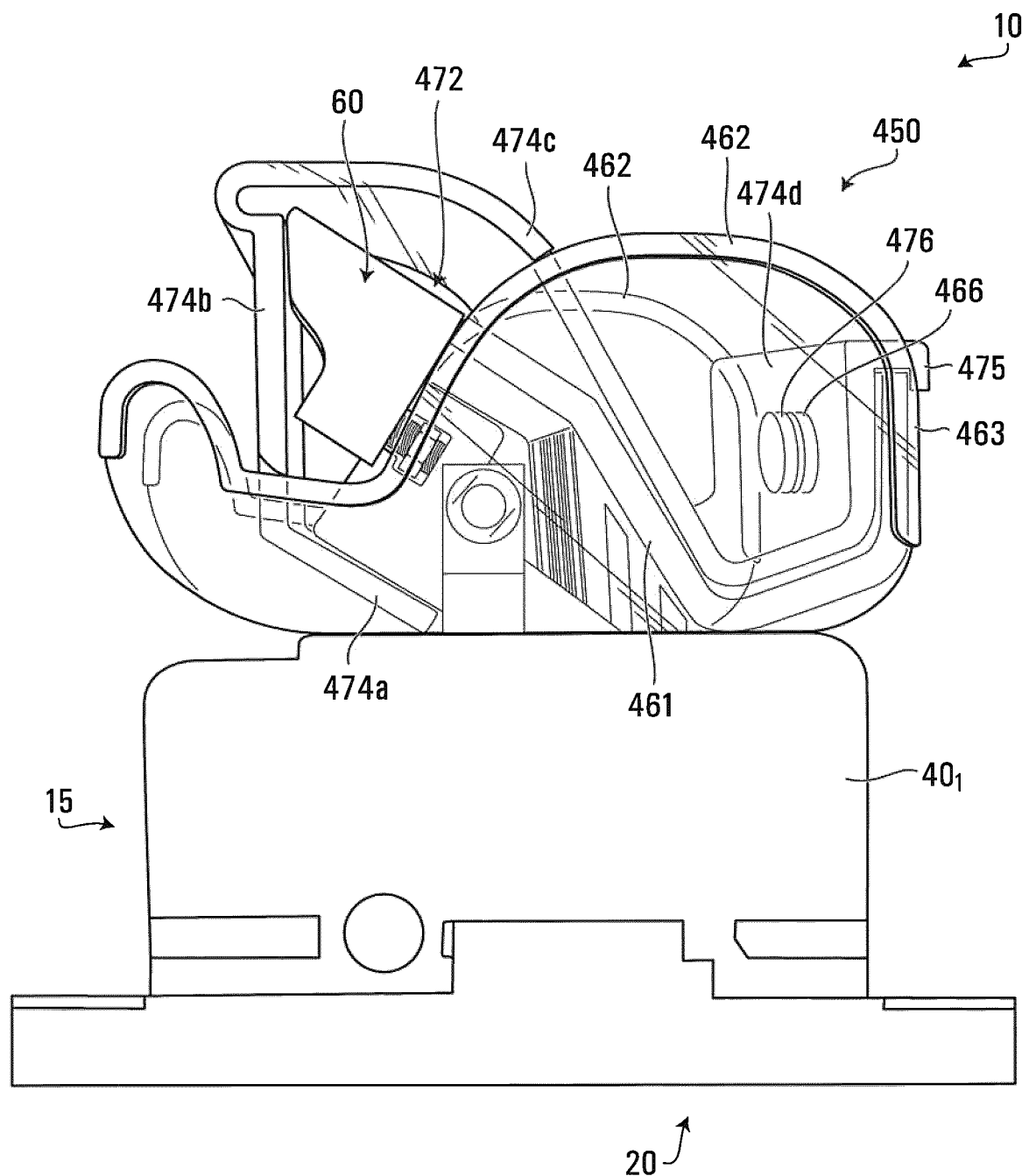
FIG. 16 is a side elevational view of the handle locking device mounted on the test switch.
Figure 17A:
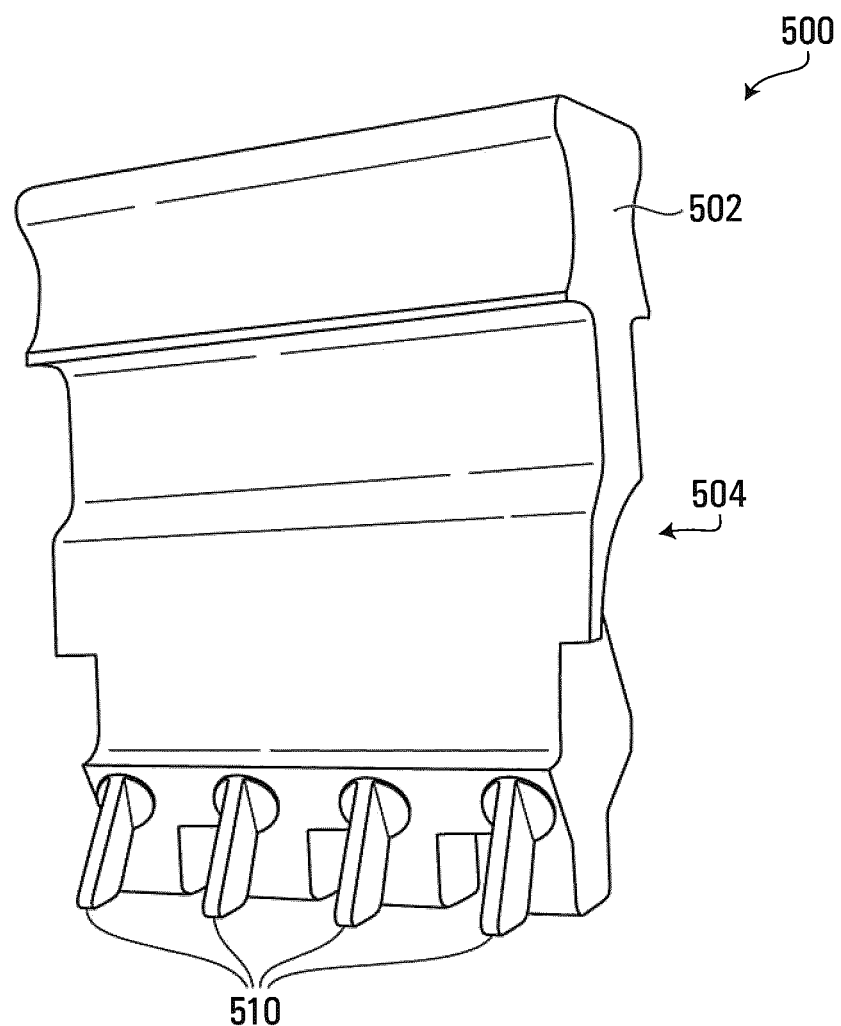
Figure 17D:
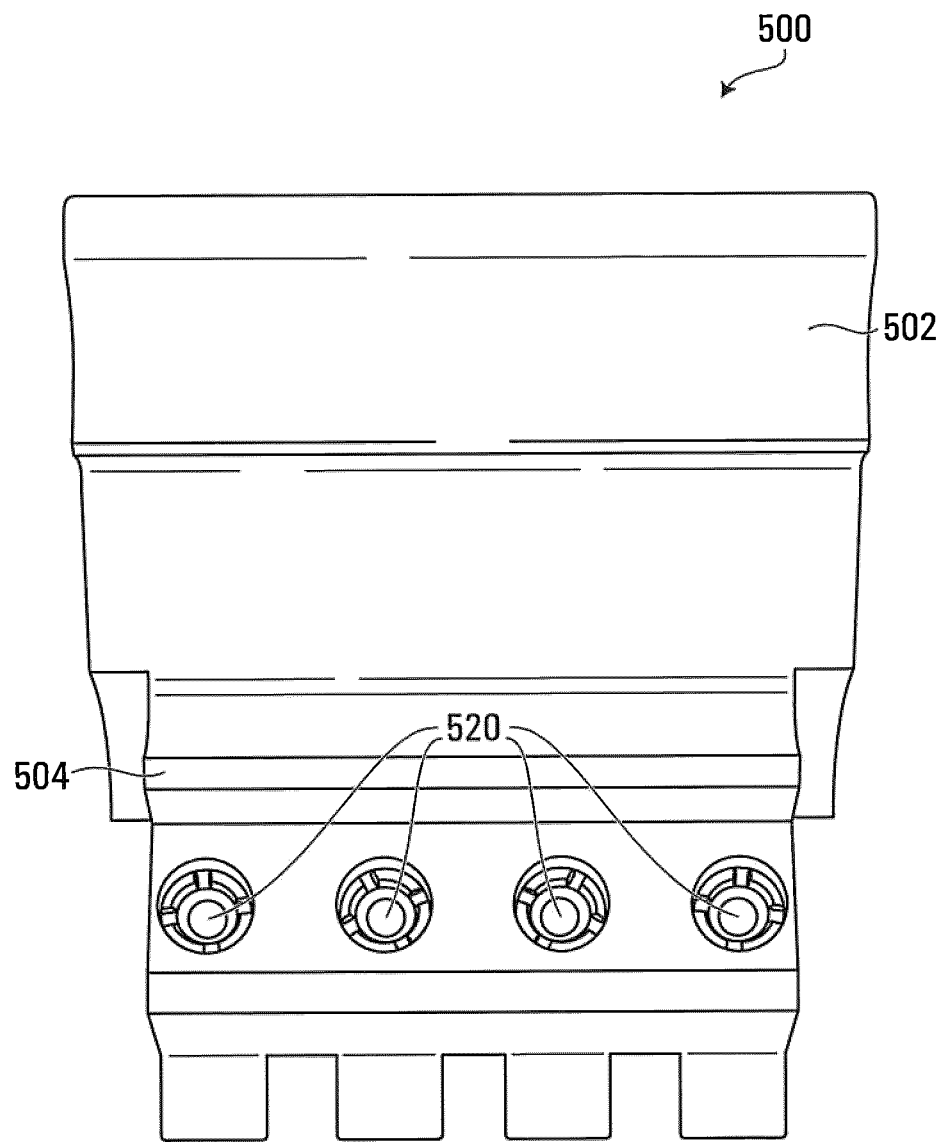

FIG. 16 illustrates the operation of the locking device, and specifically the operation of the enclosure 450. In contrast to the embodiment illustrated in FIG. 13, the enclosure 450 shown in FIG. 16 is designed to prevent the handle assembly 60 from being closed. Therefore, its purpose is somewhat different; it is not merely to prevent tampering with the handle assembly 60, but also to prevent the handle assembly 60 from acquiring a certain operative position. Typically, the enclosure 450 as pictured illustrated in FIG. 16 is used in instances where a user may be connecting test equipment and a safety device is necessary to ensure the test equipment will remain disconnected from the power distribution electrical equipment while the work is underway. Before the work on the test equipment begins, the user will open the handle assembly 60 by rotating the handle assembly 60 up, as FIG. 16 shows. The base portion 460 can then be slipped on the handle assembly 60, followed by the cover portion 470. When the cover portion 470 is received within the base portion 460, the oblique wall segment 474a resides under the handle assembly 60 while the internal partition 461 resides above the handle assembly 60. The cover portion 470 can be locked to the base portion 460 by using a suitable lock extending through the apertures 466, 476. In this fashion, the cover portion 470 cannot be removed from the base portion 460.

In embodiments where the test switch 10 includes the recessed portions 263, as shown in FIG. 10, configured to be used in conjunction with the pull bar 300, the locking device may be designed to allow the test switch 10 from being operated with pull bar 300 while the locking device is in place. With reference to FIGS. 10 and 13B, an embodiment of the test switch 10 which includes the recessed portions 263 may be placed in the enclosure 410 which uses the cover portion 420b, which allows the handle assembly 60 to assume any position between the opened position and the closed position, inclusively. In such an embodiment, the enclosure 410 may present one or more openings (not pictured), through which at least part of the pull bar 300 can be inserted, which allows the pull bar 300 to contact the handle assembly 60. More specifically, in such an embodiment, once the pull bar 300 is inserted through one of the one or more openings, the pull bar 300 can cause the handle assembly 60 to rotate between the opened position and the closed position. Thus, the enclosure 410 with the cover portion 420b and the openings ensures that the handle assembly 60 is only rotated between the opened position and the closed position with the use of the pull bar 300.

Figure 32A:
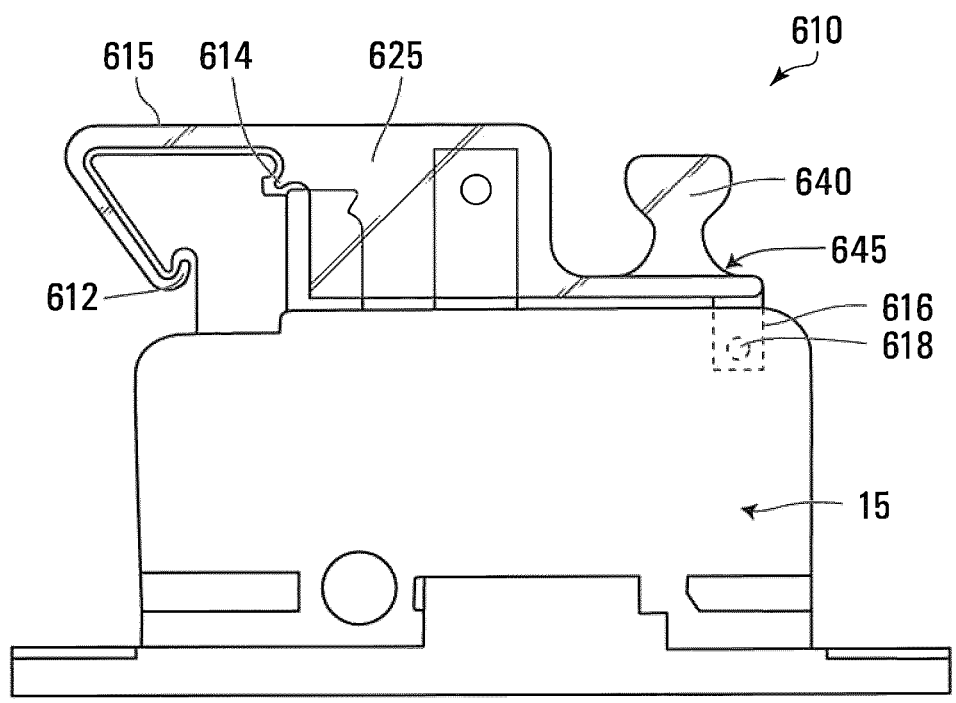
FIGS. 32A and 32B are side and rear elevation views of an enclosure of the test switch in accordance with an alternative embodiment.
Figure 32B:
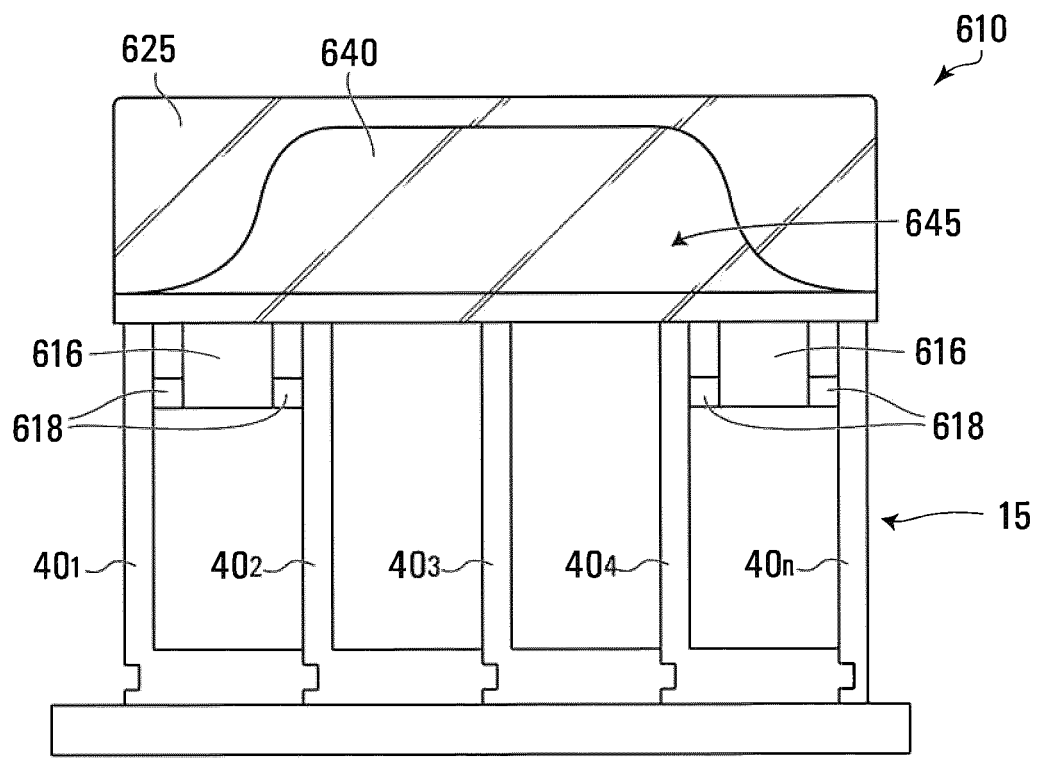

With reference to FIGS. 32A and 32B, another embodiment of the locking device will now be described. This embodiment of the locking device includes an enclosure 610 configured to prevent access to the test switch from a top thereof. The enclosure 610 of the locking device does not necessarily prevent actuation of the handle assembly 60 by the operator. Rather, the enclosure 610 only prevents a top side of the test switch from being exposed such that the operator may not contact electrically conductive material of the test switch. To that end, the enclosure 610 includes a front portion 615 for covering the handle 62 of the handle assembly 60, a middle portion 625 for covering the short-circuit connectors 80, and a rear portion 645 for affixing the enclosure 610 to the test switch.

The front portion 615 of the enclosure 610 is configured to fit over the handle 62 and adjacent components. To that end, the front portion 615 has a shape that corresponds to the shape of the handle 62. Notably, in this embodiment, the front portion 615 comprises first and second protrusions 612, 614 which are configured to fit into respective recessed portions of the handle 62 (e.g., similar to the recessed portion 263 shown in FIG. 10).

The middle portion 625 of the enclosure 610 is configured to fit over the short-circuit connectors 80. To that end, the middle portion 625 is shaped and dimensioned to accommodate the short-circuit connectors 80 underneath the middle portion 625. For instance, in this particular embodiment, the middle portion 625 has a height similar to that of the front portion 615 of the enclosure 610.

The rear portion 645 of the enclosure 610 comprises attachment members 616 for attaching the enclosure 610 to the body 15 of the test switch 10. In this particular embodiment, the attachment members 616 consist of arms protruding downwardly from the enclosure 610 and configured to fit between adjacent ones of the pole-isolating barriers $40_{1-n}$ as best shown in FIG. 32B. Moreover, each attachment member 616 comprises one or more mounting elements 618 for snugly fitting the attachment member 616 between the adjacent pole-isolating barriers $40_{1-n}$. In this particular embodiment, the mounting elements 618 are made of an elastomeric material (e.g., rubber). The rear portion 645 of the enclosure 610 further comprises a handle 460 for handling the enclosure 610. That is, in use, the operator holds the enclosure 610 by the handle 640 in order to apply the enclosure onto the test switch or remove the enclosure 610 from engagement with the test switch.

Figure 33:
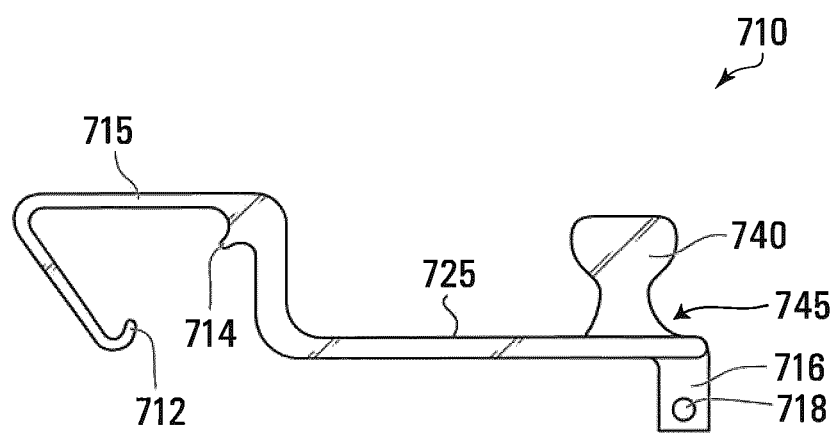
FIG. 33 is a side elevation view of a variant of the enclosure of FIGS. 32A and 32B.

FIG. 33 shows an enclosure 710 that is a variant of the enclosure 610 shown in FIGS. 32A and 32B. The enclosure 710 is similar to the enclosure 610, however the enclosure 710 is configured to fit over the test switch 10 in embodiments in which the test switch does not comprise the short-circuit connectors 80. The enclosure 710 comprises front, middle and rear portions 715, 725, 745, the front and rear portions 715, 745 being configured in a similar fashion to the front and rear portions 615, 645 of the enclosure 610. However, the middle portion 725 of the enclosure 710 has a height that is inferior to a height of the front portion 715 and inferior to a height of the handle 740.

With reference to FIGS. 17A-D and 18, the test switch 10 may also be used in conjunction with a current injector 500. The current injector 500 may be shaped as a generally rod-like member, though other configurations are also considered, and may comprise a handle 502 rotatable about an axis 504. The current injector 500 may be made of any suitably-electrically-isolating material, such as any suitable plastic. The current injector 500 further comprises one or more injector probes 510 and a corresponding number of probe connectors 520, which may be any suitable type of connector; both the injector probes 510 and the probe connectors 520 which may be molded into the current injector 500, and may be made of any suitably-electrically-conductive material, including any suitable metal, such as copper.

Each of the injector probes 510 is configured to be inserted in a respective one of the pole connectors 50 when the handle assembly 60 is in the opened position, and may take on any suitable shape therefor. With reference to FIGS. 17A-D, the injector probes 510 are generally triangular plate-like projections extending from an end of the current injector 500 and have a thickness similar to that of the lever arms 64 (or 264). Each of the injector probes 510 is electrically coupled to a respective probe connector 520. The probe connectors 520 are configured to connect to calibration equipment (not pictured); the calibration equipment may be connected by any suitable means therefor, including plug terminals, screw terminals, and the like.

Figure 18:
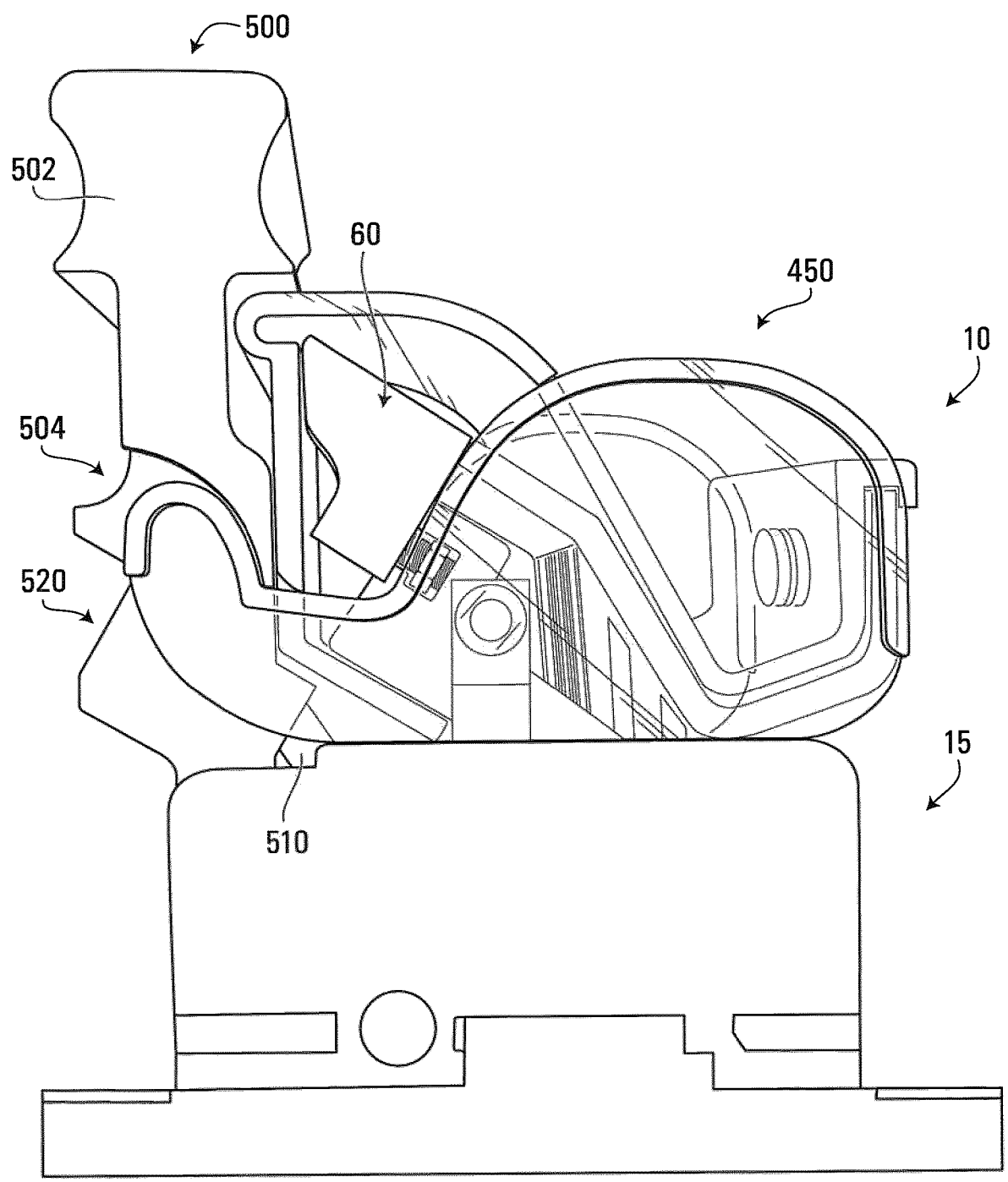
FIG. 18 is a side elevational view of a test switch with the handle locking device, also receiving the current injector shown in FIGS. 17A-D.

With continued reference to FIG. 18, when the test switch 10 is in the opened position, the current injector 500 may be inserted such that the injector probes 510 are placed into contact with the pole connectors 50. This connects the calibration equipment, which is connected to the probe connectors 520, with the test equipment connected at the pole connectors 50, thereby allowing a user of the test switch 10 to perform calibration, as well as tests and other verifications, of the test equipment without having to disconnect the power distribution electrical equipment from the lever terminals 68. Of course, other uses for the current injector 500 are also considered.

Figure 19A:
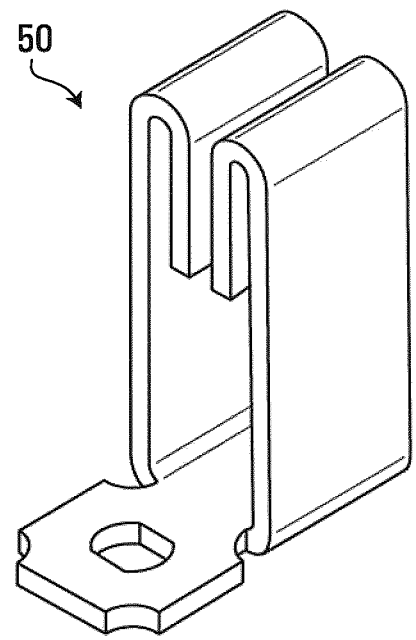
FIGS. 19A-B are perspective and front elevational views of a pole connector.
Figure 19B:
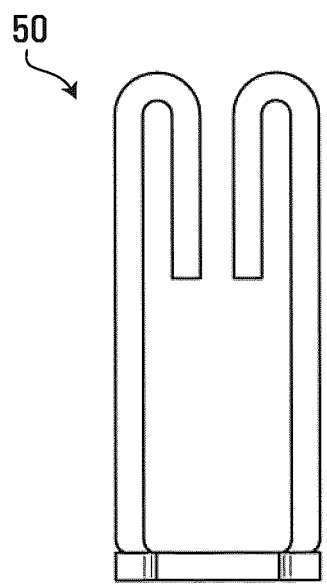

With reference to FIGS. 19A-B, the pole connector 50 is shown, which, as described above, comprises two hooked plate-like members joined at their base. With reference to FIGS. 20A-E, alternate embodiments of the pole connector are shown, according to variants.

Figure 20A:
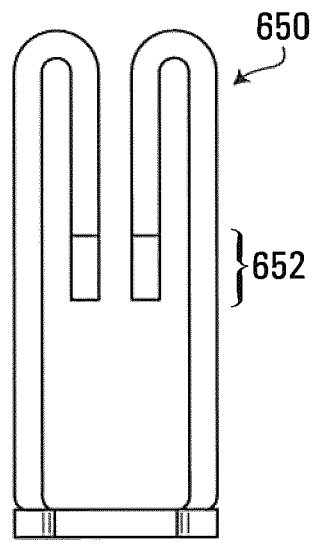
FIGS. 20A-E are front elevational views of alternative configurations of a pole connector.
Figure 20B:
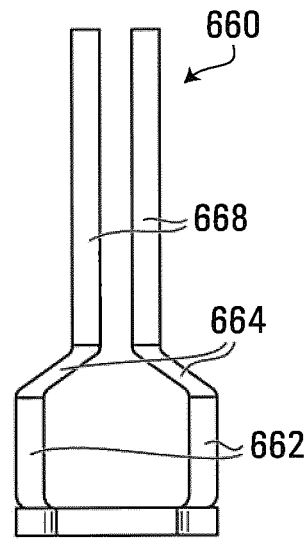
Figure 20C:
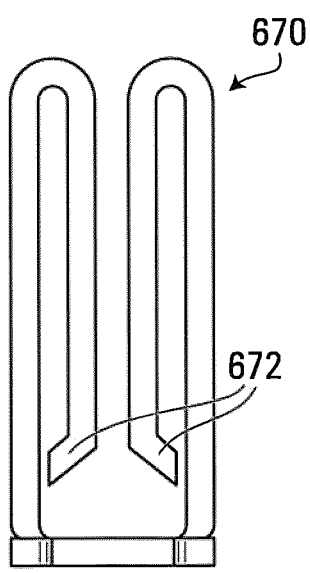
Figure 20D:
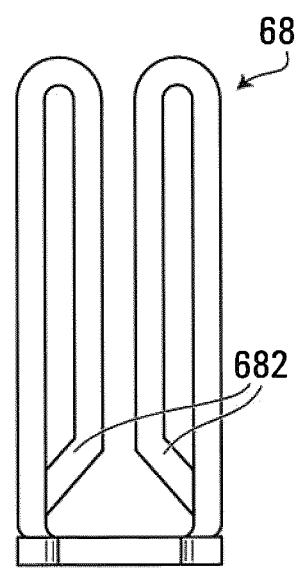
Figure 20E:
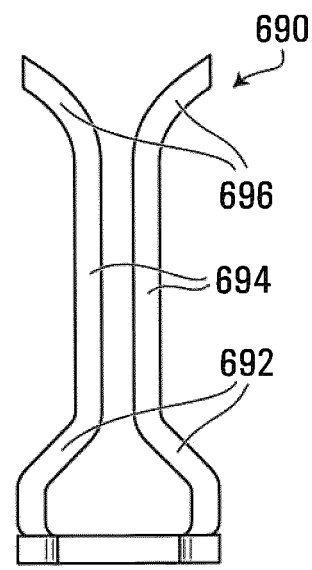

With reference to FIG. 20A, a first alternative embodiment, pole connector 650, comprises two hooked plate-like members joined at their base and an extended portion 652, which may increase an area of electrical contact between the pole connector 650 and the lever arm 64 (or 264), or the injector probe 510. With reference to FIG. 20B, a second alternative embodiment, pole connector 660, comprises two bent plates, each having a first straight portion 662, a bent portion 664 connected to the first straight portion 662, and a second straight portion 668 connected to the bent portion 664 opposite the first straight portion 662. A gap between the first bent portions 662 may be larger than a gap between the second bent portion 668, and the gap between the two straight portions 668 may generally be somewhat smaller than a thickness of the lever arms 64 (or 264). With reference to FIG. 20C, a third alternative embodiment, pole connector 670, comprises two elongated hooked plate-like members joined at their base, each comprising a bent portion 672 proximate the base which bends towards an outer-hook wall while defining a gap between the bent portions 672 and the outer-hook wall. With reference to FIG. 20D, a fourth alternative embodiment, pole connector 680, comprises two elongated hooked plate-like members joined at their base, each comprising a bent portion 682 proximate the base which bends towards and contacts an outer-hook wall. With reference to FIG. 20E, a fifth alternative embodiment, pole connector 690, comprises two bent plate-like members extending from a base, each comprising a bent portion 692 which extends from the base, a straight portion 694 connected to the bent portion 692, and a lip portion 696 connected to the straight portion 694 opposite the bent portion 692. The straight portions 694 may define a gap between them which may generally be somewhat smaller than a thickness of the lever arms 64 (or 264), and the lipped portions 696 may define a gap wider than the gap between the straight portion 694.

Figure 21A:
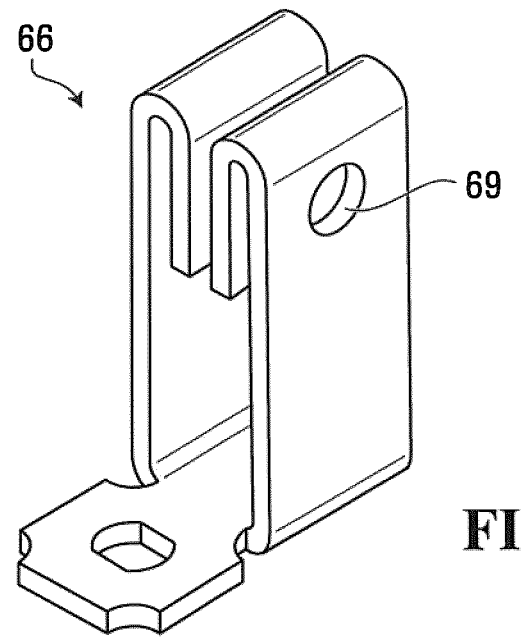
FIGS. 21A-B are perspective and front elevational views of a terminal connector.
Figure 21B:
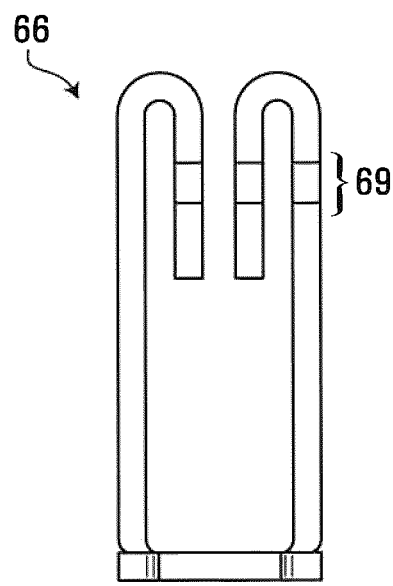
Figure 21C:
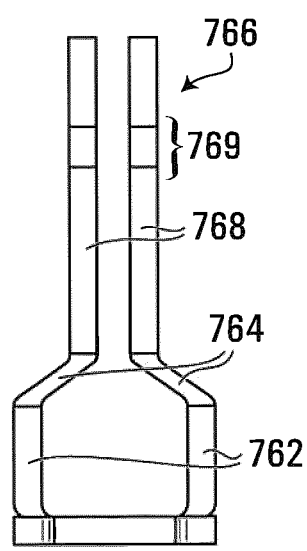
FIG. 21C is a front elevational view of an alternative terminal connector.

With reference to FIGS. 21A-B, the lever connector 66 comprises a pair of hook-shaped plates connected at their base and spaced apart from one another, thereby defining a gap. The lever connector 66 also defines one or more apertures 69 suitable for receiving a retaining pin 67 for securing a respective one of the lever arms 64 between the two hook-shaped plates of a respective lever connector 66. With reference to FIG. 21C, an alternative embodiment of the lever connector 66 is shown, which may comprise two bent plates, each having a first straight portion 762, a bent portion 764 connected to the first straight portion 762, and a second straight portion 766 connected to the bent portion 764 opposite the first straight portion 762. A gap between the first bent portions 762 may be larger than a gap between the second bent portion 766, and the gap between the two second straight portions 766 may generally be somewhat smaller than a thickness of the lever arms 64 (or 264). This embodiment of the lever connector may still comprise an aperture, 769, for receiving a retaining pin 67.

Figure 22A:
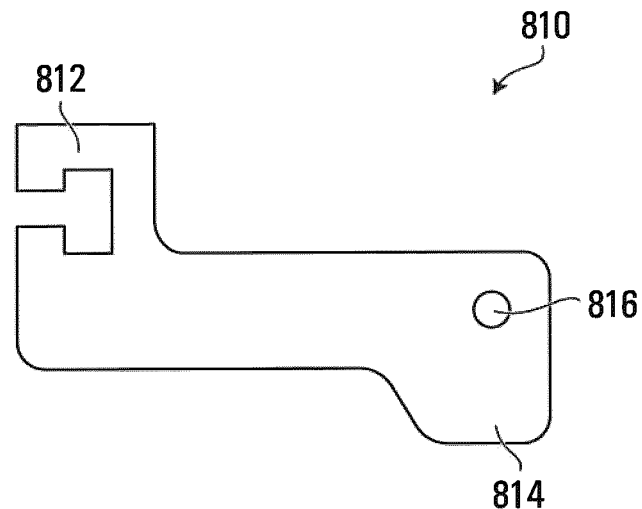
FIGS. 22A-B are side views of lever arms for the test switch.
Figure 22B:
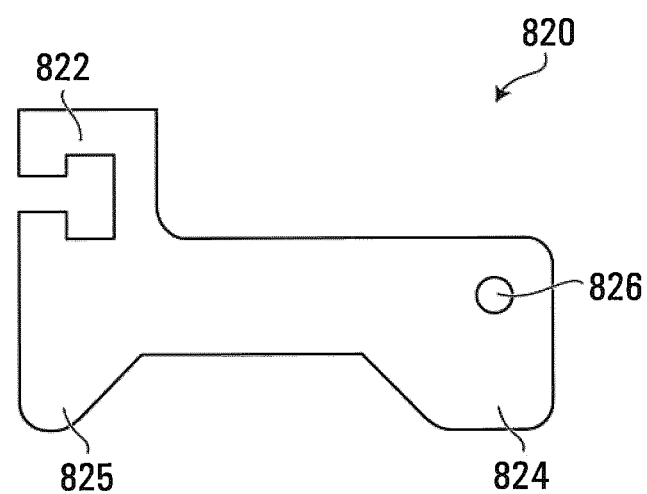

With reference to FIGS. 22A-B, alternative embodiments 810, 820, of the lever arm 64 are considered. With reference to FIG. 22A, the first alternative lever arm 810 comprises a first end 812 for being retained within the handle assembly 60 and a second end 814 comprising a lobed portion. The alternative lever arm 810 also comprises an aperture 816 configured for receiving a retaining pin 67. The lever arm 810 is retained within the handle 62 (or 262) of the handle assembly 60 by any suitable means at the first end 812, and the lobed portion on the second end 814 serves to increase the contact area between the lever arm 810 and the lever connector 66 (or any variant lever connector) within which the lever arm 810 is retained. With reference to FIG. 22B, the second alternative lever arm 820 comprises a first end 822 for being retained within the handle assembly 60 and having a first lobed portion 825, and a second end 824 comprising a second lobed portion. The alternative lever arm 820 also comprises an aperture 826 configured for receiving a retaining pin 67. The lever arm 820 is retained within the handle 62 (or 262) of the handle assembly 60 by any suitable means at the first end 822, and the second lobed portion on the second end 824 serves to increase the contact area between the lever arm 810 and the lever connector 66 (or any variant lever connector) within which the lever arm 810 is retained. Similarly, the first lobed portion 825 at the first end 822 serves to increase the contact area between the lever arm 820 and the pole connector 50 (or any variant pole connector) when the handle assembly 60 is in the closed position.

With reference to FIGS. 23A-C, an alternative embodiment of the handle assembly 60 may be composed of one or more handle fingers 860. Each handle finger 860 comprises a handle portion 862 having one or more recessed portions 864, 866, fastener receiving portions 868, 869, and interlocking portions 870, 872. Each handle finger 860 additionally retains a lever arm: while FIGS. 23A-C show the handle finger 860 retaining a lever arm 810, it should be understood that any other suitable lever arm, including lever arms 64, 264, and 820, may also be retained by the handle finger 860.

A handle assembly 60 may comprise any number of handle fingers 860—generally speaking, a test switch 10 having a handle assembly 60 with handle fingers 860 will have as many handle fingers 860 as poles. In such embodiments, rather than the handle assembly 60 as a whole being movable between the opened position and the closed position, each of the handle fingers 860 is individually movable between the opened position and the closed position. In this way, a user of the test switch 10 may be able to control with additional granularity which elements of the test equipment connected at the pole terminal 52s are connected to the power distribution electrical equipment. In embodiments of the handle finger 860 where the handle portion 862 comprises one or more recessed portions 864, 866, the pull bar 300 can be used by a user of the test switch 10 to move the handle fingers 860 between the opened position and the closed position.

Additionally, the interlocking portions 870, 872 of a given handle finger 860 are mateable with the interlocking portions 872, 870, respectively, of adjacent handle fingers 860 to secure the given handle finger 860 to adjacent handle fingers 860. More specifically, interlocking portions 870 of each handle finger 860 project from the handle portion 862; conversely, interlocking portions 872 are cavities suitable for receiving interlocking portions 870 for an adjacent handle finger 860. When a first handle finger 860 is rotated into the opened position or the closed position, and an adjacent second handle finger 860 is already in said position, the interlocking portions 870, 872 (or vice-versa) of the first and second handle fingers 860 mate with one-another, thereby securing the first handle finger 860 to the second handle finger 860.

The fastener receiving portions 868, 869, are cavities suitable for receiving one or more fasteners or fastening aids (not pictured), including screws, bolts, nuts, washers, and the like. In some embodiments of the handle fingers 860, the fastener receiving portion 868 is circular, and the fastener receiving portion 869 is quadrilateral. In other embodiments, the particular configuration of the fastener receiving portions 868, 869, is reversed, or may be implemented in other suitable fashions.

While the handle finger 860 as described above related to handle fingers 860 for a single pole, some embodiments of the handle assembly may comprise handle finger portion elements (not pictured) for two, three, or more poles at a time, and may interlock with adjacent handle finger portion elements for any number of poles. In such embodiments, the total number of handle fingers 860 will be proportional to both the number of poles of the test switch 10 and the number of poles of each of the handle finger portion elements.

In some embodiments, with reference to FIGS. 24 to 31, each short-circuit connector 80 may not include a connector at its top portion, such as the retaining pin 82. For instance, the short-circuit connector 80 may constitute a one-piece component that is integrally built. For example, as shown in FIGS. 24A to 24C, a short-circuit connector 180 may constitute a single piece that comprises a bent plate including two opposing arms $182_1$, $182_2$. The bent plate of the short-circuit connector 180 comprises a number of bends such that each arm $182_i$ comprises a first portion 183, a second portion 187 opposite to the first portion 183, and a looped portion 185 between the first and second portions 183, 187. As such, the arm $182_i$ is generally shaped like an inverted U at its top portion, where the looped portion 185 is located. The looped portion 185 is configured to abut the lever arm 64 when the handle assembly 60 is rotated into the opened position. Each arm $182_i$ also includes an end portion 188 (at its second portion 187) that is bent such that it converges towards a center of the short-circuit connector 180 in a widthwise direction of the short-circuit connector 180 and then diverges away from the center of the short-circuit connector 180 in the widthwise direction of the short-circuit connector 180. The end portions 188 of the opposing arms $182_1$, $182_2$ are opposite one another such that their respective inner surfaces face one another and define a gap 190 therebetween. The gap 190 may be generally smaller than a thickness of the lever arms 64 such that when the handle assembly 60 is rotated into the opened position, a respective lever arm 64 comes into contact with and pushes the end portions $188_1$, $188_2$ of the arms 182, 184 apart slightly.

The short-circuit connector 180 also comprises a pair of insulating members $186_1$, $186_2$ opposite and facing one another and affixed to a respective arm $182_1$, $182_2$. Each insulating member $186_i$ is made of electrically insulating material. The insulating members $186_1$, $186_2$ may be affixed to the arms $182_1$, $182_2$ in any suitable way (e.g., via adhesive). In this particular embodiment, each insulating member $186_i$ is tapered such that a thickness of the insulating member $186_i$ increases from its bottom end to its top end. As such, a spacing between the insulating members $186_1$, $186_2$ is greater at a bottom portion than at a top portion of the insulating members 186₁, 186₂. This configuration of the short-circuit connector 180 may minimize risk of causing a short-circuit through contact of the lever arm 64 with the bent plate of the short-circuit connector 180 before it reaches its intended engagement of the short-circuit connector (i.e., by being introduced between the end portions 188 of the arms 182₁, 182₂). That is, the lever arm 64 may be prevented from touching the bent plate of the short-circuit connector 180 before reaching the end portions of the arms 182₁, 182₂.

Figure 25:
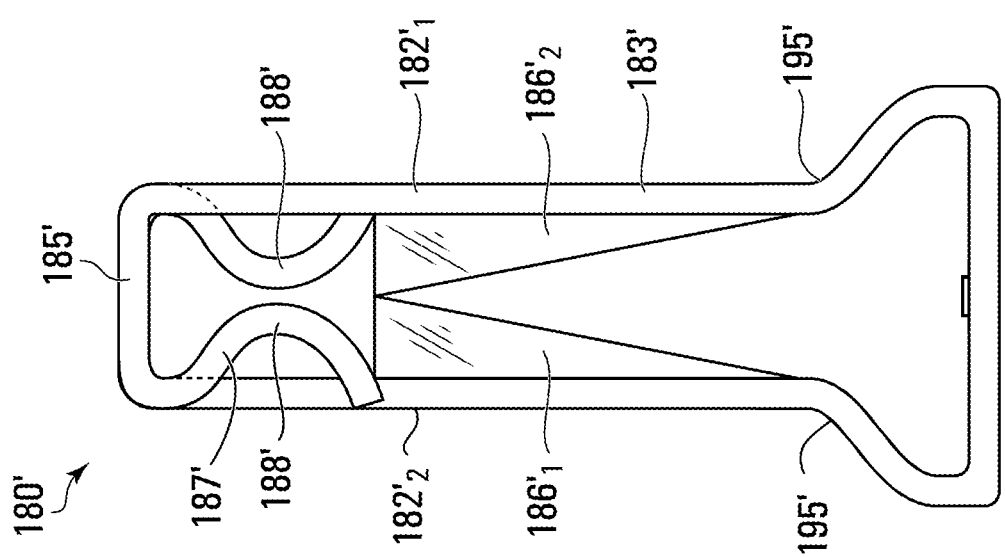
FIG. 25 is a front elevation view of a variant of the short-circuit connector of FIGS. 24A to 24C.

FIG. 25 shows a short-circuit connector 180' that is configured similarly to the short-circuit connector 180 with the exception that each opposing arm 182₁', 182₂' comprises a base bent portion 195' that causes the arms 182₁', 182₂' to converge closer to one another, such that a spacing between the arms 182₁', 182₂' is generally smaller.

Figure 26:
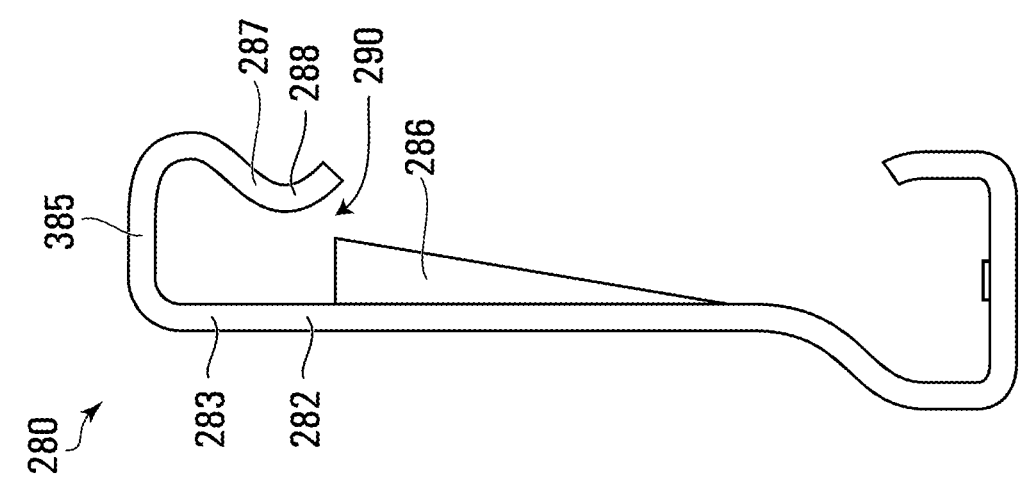
FIG. 26 is a front elevation view of the short-circuit connector in accordance with another embodiment.

FIG. 26 shows the short-circuit connector in accordance with another embodiment. The short-circuit connector 280 of FIG. 26 comprises a single arm 282 (i.e., no opposing arm) that has a generally inverted-U shape similar to the one described above in respect of the short-circuit connectors 180. The single arm 282 comprises a first portion 283, a second portion 287 opposite to the first portion 283, and a looped portion 285 between the first and second portions 283, 287. The single arm 282 thus has an inverted U shape at its top portion. The single arm 282 of the short-circuit connector 280 comprises an insulating member 286 affixed to an inner side of the arm 282. An outer surface of the insulating member 286 (i.e., the surface that engages the lever arm 64) faces an inner surface of an end portion 288 of the arm 282 where the arm 282 converges towards a center of the short-circuit connector 280 in a widthwise direction of the short-circuit connector 280. As such, in use, when the handle 62 is lifted, the lever arm 64 first engages the insulating member 286 and then is led into a gap 290 between the insulating member 286 and the end portion 288 of the arm 282 such as to cause a short-circuit when it contacts the end portion 288. FIG. 29 shows a short-circuit connector 580 which is a variant of the short-circuit connector 280. The short-circuit connector 580 comprises a protruding arm 589 that protrudes from the arm 582 to abut the lever arm 64 when the lever arm 64 engages the short-circuit connector 580. The protruding arm 589 is lower than a looped portion 585 of the arm 582.

Figure 27:
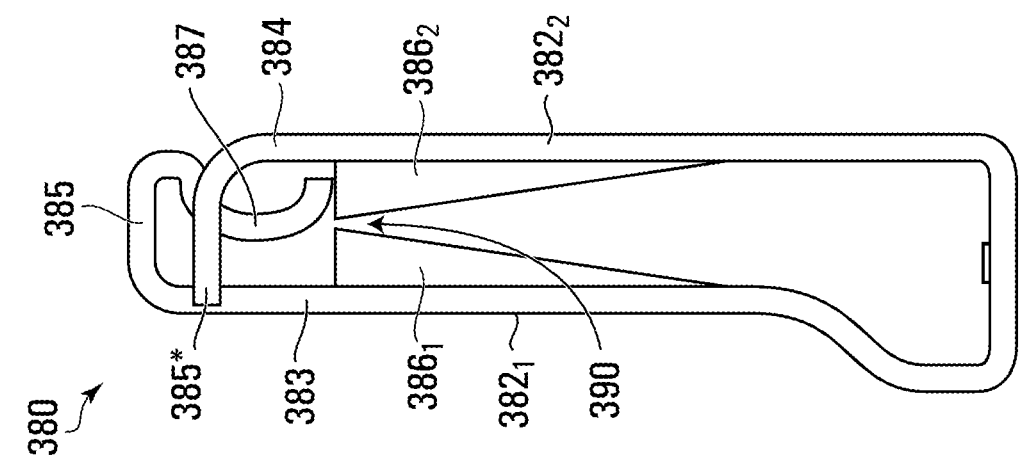
FIG. 27 is a front elevation view of the short-circuit connector in accordance with another embodiment.

FIG. 27 shows the short-circuit connector in accordance with another embodiment. The short-circuit connector 380 of FIG. 27 comprises two opposing arms 382₁, 382₂. The first arm 382₁ has a generally inverted-U shape at its top portion with an end portion that converges towards a center of the short-circuit connector 380 in a widthwise direction of the short-circuit connector 380. The second arm 382₂ has a first portion 384 and a second portion 385* transversal to the first portion 384 such that the second arm 382₂ has an inverted-L shape at its top portion and is configured to act as an abutment to the lever arm 64 when the lever arm 64 engages the short-circuit connector 380. The opposing arms 382₁, 382₂ comprise insulating members 386₁, 386₂ similar to the insulating members 186₁, 186₂ and defining a gap 390 therebeteween.

Figure 28B:
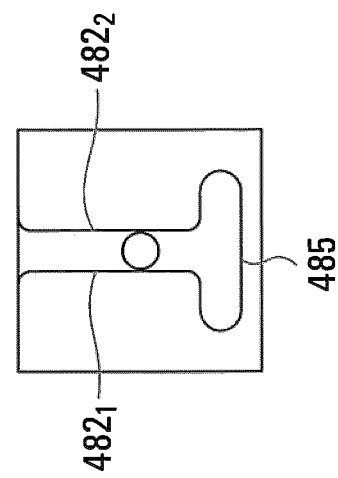
FIGS. 28A and 28B are front and top views of the short-circuit connector in accordance with another embodiment.
Figure 28A:
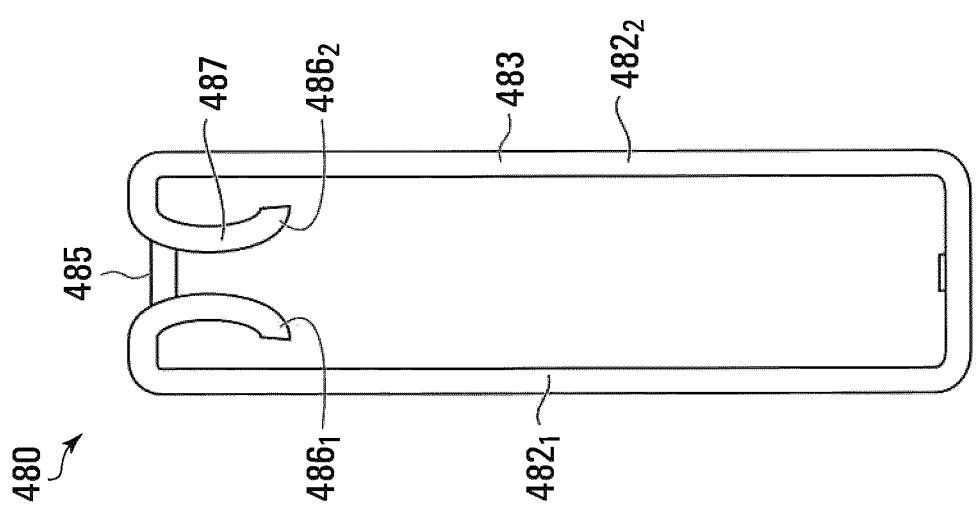

With reference to FIGS. 28A and 28B, a short-circuit connector 480 in accordance with another embodiment is shown. The short-circuit connector 480 includes a bent plate comprising opposing arms 482₁, 482₂. Each arm 482ᵢ comprises a first portion 483 and a second portion 487 opposite to the first portion 483. The first and second portions 483, 487 are looped at their top. Neither one of the arms 482₁, 482₂ crosses over a center of the short-circuit connector 480 in a widthwise direction of the short-circuit connector 480. The second portions 487 of the arms 482₁, 482₂ define a gap therebetween. A top extension 485 of the short-circuit connector 480 extends between the arms 482, 484 at a top portion thereof to abut the lever arm 64 when it engages the gap between the end portions 486₁, 486₂ of the arms 482, 484.

With reference to FIG. 30, a short-circuit connector 680 in accordance with another embodiment is shown. The short-circuit connector 680 comprises a single arm 682 that is bent such as to include a first portion 683, a second portion 687 opposite to the first portion 683, and a looped portion 655 between the first and second portions 683, 687. The looped portion 655 is configured to abut the lever arm 64 when it engages the short-circuit connector 680. An end portion 688 of the single arm 682 (at its second portion 687) is bent such that it converges inwardly towards a center of the short-circuit connector 680 in a widthwise direction of the short-circuit connector 680 and then diverges outwardly away from the center of the short-circuit connector 680 in the widthwise direction of the short-circuit connector 680. The short-circuit connector 680 further comprises an insulating member 686 made of electrically insulating material and affixed to the arm 682 at its first portion 683. The end portion 688 and the insulating member 686 are opposite to one another and define a gap 690 therebetween. The insulating member 686 is tapered upwardly such that a thickness of the insulating member 686 is greater at a top end of the insulating member 686 than at a bottom end of the insulating member 686.

With reference to FIG. 31, a short-circuit connector 780 in accordance with another embodiment is shown. The short-circuit connector 780 is similar to the short-circuit connector 680 described above, notably comprising a single arm 782 that is bent such as to include a first portion 783, a second portion 787 opposite to the first portion 783, and a looped portion 755 between the first and second portions 783, 787. As such, the arm 782 has an inverted U-shape. An end portion 788 of the arm 782 (at the second portion 787) is parallel to the first portion 783. In other words, the second portion 787 does not converge or diverge such as the second portion 687 of the short-circuit connector 680. The short-circuit connector 780 further comprises an insulating member 786 made of electrically insulating material and affixed to the arm 782 at its first portion 783. The short-circuit connector 780 defines a gap 790 between the end portion 788 and the insulating member 786.

Certain additional elements that may not be needed for the operation of some of the embodiments may not have been described or illustrated, as they are assumed to be within the purview of those of ordinary skill in the art. Moreover, certain embodiments may be free of, may lack, and/or may function without any element that is not specifically disclosed herein.

Although various embodiments and examples have been presented in the present disclosure, this was for the purpose of describing, but not limiting, the invention. Various modifications and enhancements will become apparent to those of ordinary skill in the art and are within the scope of the invention.

What is claimed is:
1. An electrical test switch for testing electrical equipment, the electrical test switch comprising:
 a base comprising:
  a plate element comprising a plurality of mounting apertures, a first subset of the mounting apertures being configured to receive first fasteners for mounting the base to a mounting surface of the electrical equipment;

a body mounted to the base, the body comprising:
- a plurality of pole-isolating barriers positioned parallel to one another and affixed to the base via a second subset of the mounting apertures, the second subset of the mounting apertures being configured to receive second fasteners for mounting the body to the base;
- at least one pole connector disposed between adjacent ones of the pole-isolating barriers, each pole connector defining a pole of the test switch; and
- a handle assembly configured to selectively engage or disengage the at least one pole connector such as to electrically connect or disconnect the test switch to the electrical equipment;

wherein the plate element has a top surface and a bottom surface opposite to the top surface, the top surface of the plate element facing the body of the test switch, the base comprising an abutment member protruding from the top surface of the plate element and configured to engage a recess in a given one of the pole-isolating barriers;

wherein the abutment member interlocks with the recess of the given one of the pole-isolating barriers.

2. The electrical test switch of claim 1, wherein the first fasteners are torqued by a user of the test switch.

3. The electrical test switch of claim 1, wherein the second fasteners are tamperproof.

4. The electrical test switch of claim 3, wherein the second fasteners have a tamper-proof head design.

* * * * *